(12) United States Patent
Nakamura et al.

(10) Patent No.: US 7,550,556 B1
(45) Date of Patent: Jun. 23, 2009

(54) HIGHLY STABLE RESIN, HARDENABLE RESIN COMPOSITION, PRODUCTION METHOD THEREFOR, COLOR FILTER AND LIQUID CRYSTAL PANEL

(75) Inventors: Kazuhiko Nakamura, Tokyo-to (JP); Shunsuke Sega, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 09/636,571

(22) Filed: Aug. 10, 2000

(30) Foreign Application Priority Data

Aug. 11, 1999 (JP) ............................ P11-227072
Oct. 8, 1999 (JP) ............................ P11-288803

(51) Int. Cl.
*C08J 3/00* (2006.01)
*C08L 33/02* (2006.01)
*C08L 75/14* (2006.01)
*C08G 18/08* (2006.01)
*C08G 18/62* (2006.01)
*C08G 18/82* (2006.01)

(52) U.S. Cl. .......................... 528/495; 528/44; 528/69; 528/75; 528/80; 528/81; 528/84; 528/85; 528/480; 528/491; 528/496

(58) Field of Classification Search ................ 525/123, 525/131
See application file for complete search history.

(56) References Cited

U.S. PATENT DOCUMENTS 3,642,943 A * 2/1972 Noel ...................... 427/393.5
4,717,643 A   1/1988 Scheve et al.
6,432,614 B1 * 8/2002 Ueda et al. ............... 430/281.1
6,558,858 B2 * 5/2003 Ueda et al. ..................... 430/7

FOREIGN PATENT DOCUMENTS

| EP | 0 977 085 | 2/2000 |
|---|---|---|
| GB | 768119 | 2/1957 |
| GB | 1384343 | 2/1975 |
| WO | WO 95/00573 | 1/1995 |

* cited by examiner

*Primary Examiner*—Michael J Feely
(74) *Attorney, Agent, or Firm*—Ladas & Parry LLP

(57) ABSTRACT

The present invention is to prevent the rapid viscosity rise generated at the time of dissolving or dispersing in a solvent a polymer obtained by reacting a material polymer having an acidic functional group and a hydroxyl group in the principal chain part with an isocyanate compound, in particular, a photo-curing polymer obtained by reaction with a radical polymerizable group-containing isocyanate compound. A highly stable polymer can be obtained by reacting a material polymer having a principal chain including at least a component unit having an acidic functional group and a component unit having a hydroxyl group with an isocyanate compound, and further reacting the same with an alcohol. Moreover, by producing a material polymer using a non-nitrile azo-based or peroxide-based polymerization initiator and/or introducing an isocyanate compound using a polymerization inhibitor selected from the compounds represented by the above-mentioned formulae (10) and (16), the transparency can be improved. A photo-curing polymer obtained in the present invention is suited for forming a protection film of a color filter and a column-like spacer of a liquid crystal panel.

69 Claims, 2 Drawing Sheets

HIGHLY STABLE RESIN, HARDENABLE RESIN COMPOSITION, PRODUCTION METHOD THEREFOR, COLOR FILTER AND LIQUID CRYSTAL PANEL

BACKGROUND OF THE INVENTION

1. Field of the Invention

The present invention relates to a highly stable resin without the risk of bringing about undesired increase of the molecular weight or the viscosity in storage, use, or handling, such as a photo-curing resin with a good storage property, and a production method therefor.

Moreover, the present invention also relates to a hardenable resin composition containing a highly stable hardenable resin, capable of easily adjusting or evening the film thickness of a coated film without the risk of viscosity increase in storage or coating, and a production method therefor.

Furthermore, the present invention relates to a resin with excellent stability and transparency, a hardenable resin composition containing such a resin, and a production method therefor.

Still further, the present invention relates to a color filter and a liquid crystal panel with little color irregularity and contrast irregularity, with a protection film of a coloring layer and a spacer of a liquid crystal layer formed, using a highly stable hardenable resin composition, in particular, a photo-curing resin composition.

2. Description of the Related Art

Recently, as a flat display for a personal computer, color liquid crystal display devices have been propagated rapidly. As shown in FIG. 1, a color liquid crystal display device 101, in general, has a structure wherein a color filter 1 and an electrode substrate 2 such as a TFT substrate are faced with each other so as to provide a gap part 3 of about 1 to 10 μM, with a liquid crystal compound L filled in the gap part 3 and the periphery thereof sealed by a sealing member 4. The color filter 1 comprises a structure including a black matrix layer 6 formed in a predetermined pattern for blocking the light in the boundary part between the pixels, a coloring layer 7 with a plurality of colors (in general, three primary colors including red (R), green (G), and blue (B)) arranged in a predetermined order for forming each pixel or recently, a color filter, a protection film 8, and a transparent electrode film 9 successively laminated on a transparent substrate 5 in this order from the side close to the transparent substrate. Moreover, an alignment layer 10 is provided on the inner surface side of the color filter 1 and the electrode substrate 2 facing thereto. Furthermore, pearls 11 having a constant particle size are dispersed as a spacer in the gap part 3 for constantly and homogeneously maintaining the cell gap between the color filter 1 and the electrode substrate 2. A color image can be obtained by controlling the light transmittance of the pixels colored in each color or the liquid crystal layer behind the color filter.

The protection film 8 formed in the color filter serves for protecting the coloring layer and for flattening the color filter in the case a coloring layer is provided in the color filter. In a color liquid crystal display device, in the case the flatness of the transparent electrode film 9 is deteriorated due to existence of gap irregularity derived from the waviness on the surface of the transparent substrate of the color filter, gap irregularity among the R, G and B pixels, or gap irregularity within each pixel, color irregularity or contrast irregularity is generated so as to give rise to a problem of the image quality deterioration. Therefore, a high flatness is required to the protection film.

In the case the fine particle-like pearls 11 as shown in FIG. 1 are dispersed as the spacer, the pearls are dispersed randomly, independent from being behind the black matrix layer 6 or behind the pixels. In the case the pearls are disposed in the display area, that is, in the pixel part, a back lighting beam transmits the pearl part, and further, the orientation of the liquid crystal is disturbed in the vicinity of the pearls so that the display image grade is deteriorated remarkably. Then, as shown in FIG. 2, instead of dispersing the pearls, column-like spacers 12 having a height corresponding to the cell gap are formed on the inner surface side of the color filter in the area coinciding with the black matrix layer 6.

The above-mentioned protection film 8 and the column-like spacers 12 can be formed with a resin. In consideration of the adhesion property and the sealing property of the sealing part, the protection film 8 is preferably one capable of covering only the area of the transparent substrate with the coloring layer formed thereon. Moreover, the column-like spacers 12 need to be formed accurately in the area with the black matrix layer formed, that is, in the non-display area. Therefore, the protection film and the column-like spacers came to be formed with a photo-curing resin capable of easily limiting the area to be hardened by a photo mask.

Furthermore, in the case the surface applied with a photo-curing resin is developed with an organic solvent after exposure for forming the protection film or the column-like spacers, since handling and the waste liquid process are troublesome so that it is not satisfactory in terms of economy and stability, a photo-curing resin allowing an alkaline development after exposure has been developed by introducing an acidic group in a photo-curing resin.

As an alkaline-soluble photo-curing resin, for example, o-cresol novolak epoxy acrylate, or the like, having about 2,000 weight average molecular weight is known. The resin has a carboxylic acid group defining the alkaline solubility. However, since the resin uses a monomer component as an acryloyl group defining the curing property, the reliability in film formation is low. For example, it involves the risk of the residual monomer unit elution to the liquid crystal part. Furthermore, the film thickness may be reduced due to a large amount of the elution in the alkaline development.

Moreover, as a method for introducing a radical polymerizable group such as an acryloyl group into the molecular structure of a compound for providing the photo curing property, for example, a method of introducing a radical polymerizable group such as a methacryloyl group to an end by reacting of diols with excessive diisocyanate for preparing a reaction product with an isocyanate group remaining on the end, and reacting the isocyanate group of the reaction product with 2-hydroxyl ethylmethacrylate for producing urethane acrylate, is known. However, according to the method, as a principle, a (meth)acryloyl group can be introduced to only both ends of the molecular structure. Furthermore, although a method of radical polymerization by partially containing a compound having two or more radical polymerizable groups in a molecular such as a (meth)acryloyl group can be conceivable, the content of the radical polymerizable group cannot be controlled as well as a problem of gellation is also involved.

As mentioned above, although it is convenient to form the protection film and the column-like spacers of a color film with a photo-curing resin, it is difficult to control the amount of the alkaline soluble group such as a carboxyl group and the radical polymerizable group such as a (meth)acryloyl group according to the conventional photo-curing resin in consideration of the curing property and the alkaline solubility thereof.

According to the undisclosed knowledge obtained by the study of the present inventor, since the amount of the alkaline soluble carboxyl group and the radical polymerizable (meth) acryloyl group can be adjusted freely according to a copolymer resin having a principal chain comprising at least a component unit represented by the below-mentioned formula (1) and a component unit represented by the below-mentioned formula (2), with at least a part of the carboxyl group or the hydroxyl group thereof bonded with a (meth)acryloyloxy alkyl isocyanate compound represented by the below-mentioned formula (5) according to reaction of the isocyanate group of the compound, it is extremely suited as a photo-curing resin:

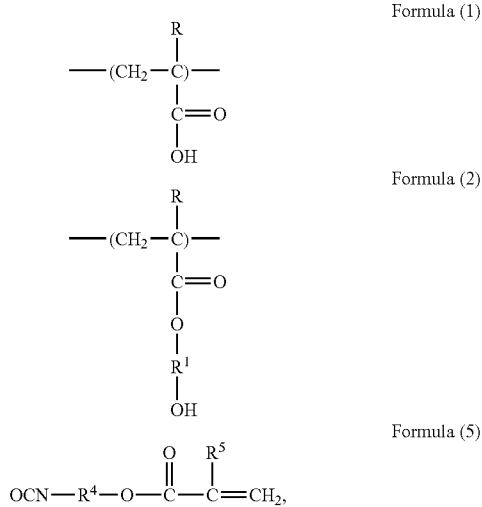

wherein R is hydrogen or an alkyl group having 1 to 5 carbon atoms, $R^1$ is an alkylene group having 2 to 4 carbon atoms, $R^4$ is an alkylene group, and $R^5$ is hydrogen or methyl.

However, it is learned that in the case the above-mentioned copolymer resin is dissolved or dispersed in a solvent and left, the molecular amount is increased rapidly so as to raise the viscosity. According to our experiment, it is confirmed that the thickening phenomenon proceeds even in a room temperature, and proceeds more rapidly as the storage temperature is higher. Moreover, in an experiment utilizing the GPC (gel permeation chromatography), only by dissolving the above-mentioned copolymer resin in a solvent and leaving the same in a room temperature for two weeks, the molecular weight, which was 69,000 at the time of preparation, was increased to as much as 98,000, and the viscosity of the solution became 1.17 times. Furthermore, by storing the copolymer resin at 70° C. for three days, the molecular weight, which was 69,000 at the time of preparation, was increased to as much as 340,000, and the viscosity of the solution became 2.14 times. Moreover, it is also confirmed that the thickening phenomenon becomes further remarkable by mixing the copolymer resin with a thermosetting epoxy resin, an acrylic monomer, a polymerization initiator, or the like, dissolving in a solvent, and storing in the state of a coating liquid to be actually used.

Since the above-mentioned copolymer resin gives rise to such a thickening phenomenon, it is extremely troublesome in terms of storage, film thickness adjustment at the time of coating, maintenance of the homogeneity of the film thickness, or the like. That is, after once preparing a photo-curing resin composition coating liquid by dissolving the above-mentioned copolymer in a solvent and mixing with other materials, refrigeration storage is prerequisite and a long term storage is not possible. Moreover, even in the case thickening in storage can be avoided, since the coating operation is executed, in general, in a room temperature, the viscosity of the coating liquid rises rapidly during the operation of a day. Therefore, unless the viscosity of the coating liquid is checked frequently so as to modify the coating condition not only before starting the operation but also during the operation, the coated film thickness cannot be adjusted constantly. Furthermore, in the case the viscosity of the coating liquid rises too much, even if the coated film thickness can roughly be adjusted by modification of the coating condition, the coating irregularity cannot be avoided so that the film thickness homogeneity of the coated film cannot be maintained. Moreover, it is also difficult to reuse the remained portion of a coating liquid once used in a room temperature the other day, or to use the remained coating liquid with a new coating liquid added thereto.

In particular, the extremely high accuracy and homogeneity are required for the film thickness of the protection film for covering the coloring layer of the color film or the height of the column-like spacers for ensuring the cell gap. Compared with the protection film to be formed continuously in a collective area on the coloring layer, since the column-like spacers are formed intermittently according to the black matrix layer formation area by a height more than double as much as the height of the coloring layer, the size fluctuation can easily be brought about due to increase of the viscosity of the coating liquid. Moreover, in the case the coating resin came to have too high a molecular amount, the shape of the column-like spacers is deteriorated so that the strength as a spacer and other dynamic characteristics are deteriorated as well.

Therefore, in the case of forming a protection film or a column-like spacer of a color filter, in particular, of forming the column-like spacer, using a coating liquid of a photo-curing resin composition containing the above-mentioned copolymer resin, the thickening phenomenon of the coating liquid should be prohibited to a minimum level.

Furthermore, a good transparency is required to a resin for forming a coloring layer or a protection layer of a color film. However, according to the knowledge of the present inventors, the above-mentioned copolymer resin does not have a sufficient transparency.

SUMMARY OF THE INVENTION

In view of the circumstances, the present invention has been achieved, and a first object thereof is to provide a method for improving the storage property and the stability of the above-mentioned photo-curing copolymer resin, and an improved hardenable polymer not liable to cause the viscosity increase compared with the above-mentioned photo-curing copolymer resin.

A second object of the present invention is to provide a method for improving the storage property and the stability of resins as a whole, conceived to cause the viscosity increase according to the same principle as the above-mentioned photo-curing copolymer resin due to the molecular structure, and an improved resin not liable to cause the viscosity increase.

A third object of the present invention is to provide an improved photo-curing resin composition containing the above-mentioned improved hardenable polymer, capable of easily controlling the coating operation, and not liable to generate the coating irregularity, and a production method for the photo-curing resin composition.

A fourth object of the present invention is to provide a resin and a photo-curing resin composition having the excellent stability, not liable to cause the viscosity increase, and having the excellent transparency, and a production method therefor.

A fifth object of the present invention is to provide a color filter and a liquid crystal panel with a protection film of a coloring layer and/or a column-like spacer of a cell gap formed, using the above-mentioned improved photo-curing resin composition.

According to the present invention, a highly stable resin comprising a polymer obtained by reacting a material polymer having a principal chain including at least a component unit having an acidic functional group and a component unit having a hydroxyl group with an isocyanate compound, and further reacting the same with an alcohol can be provided.

By reacting a material polymer having a principal chain including at least a component unit having an acidic functional group and a component unit having a hydroxyl group with an isocyanate compound, a residual group of the isocyanate compound can be introduced to the part of the acidic functional group or the hydroxyl group of the material polymer, but a part of the acidic functional group is assumed to be an acid anhydride group according to the dehydration effect of the isocyanate compound. Then, by dissolving or dispersing the polymer obtained by the above-mentioned reaction in a solvent and leaving, an acid anhydride group of a polymer molecule is assumed to react with a hydroxyl group of another polymer so as to ester-bond and cross-link the molecules, resulting in the molecular weight increase and the viscosity rise. In contrast, by further reacting the polymer obtained by the above-mentioned reaction with an alcohol, the alcohol is assumed to be added to the acid anhydride group part so as to be esterified for inhibiting the cross-linking reaction among the polymer molecules, and as a result, the molecular weight increase and the viscosity rise can be prevented.

Such a highly stable resin obtained by the alcohol treatment is assumed to have a molecular structure having a principal chain including at least a component unit having an acidic functional group and a component unit having a hydroxyl group, wherein an isocyanate compound is amido-bonded with at least a part of the acidic functional group via an isocyanate group of the isocyanate compound and/or urethane-bonded with at least a part of the hydroxyl group, and an alcohol is ester-bonded with at least a part of the acidic functional group via a hydroxyl group of the alcohol.

In order to produce the above-mentioned highly stable resin, for example, an alcohol can be added to a reaction liquid obtained by reacting a material polymer having a principal chain including at least a component unit having an acidic functional group and a component unit having a hydroxyl group with an isocyanate compound, or a solution prepared by dissolving or dispersing the polymer produced from the reaction liquid again in a solvent, before viscosity rise of the reaction liquid or the solution, or before completion of viscosity rise. In order to stop the viscosity rise of the polymer solution substantially completely, it is preferable to leave or heat the polymer solution for a predetermined time after adding the alcohol for maturation of the alcohol treatment polymer.

In the present invention, it is preferable that polymerization reaction of a compound having a double bond-containing group and an acidic functional group with a compound having a double bond-containing group and a hydroxyl group is executed, using a non-nitrile azo-based polymerization initiator or a peroxide-based polymerization initiator at the time of forming the material polymer for the highly stable resin, that is, the principal chain part of the highly stable resin.

Moreover, it is preferable that at the time of reacting the material polymer with the isocyanate compound, a polymerization inhibitor selected from the group consisting of a phenol-based compound represented by the below-mentioned formula (10) and a phosphite-based compound represented by the below-mentioned formula (16) is used. In the case a highly stable resin is synthesized, using the above-mentioned specific polymerization initiator and/or polymerization inhibitor, the obtained reaction liquid shows a high light transmittance in the visible area and the ultraviolet area. Therefore, by using the reaction liquid containing the highly stable resin as the coating liquid as it is, a film with the excellent transparency can be formed. Moreover, in the case the highly stable resin is a photo-curing copolymer resin, the exposure sensitivity can be improved by improving the light transmittance in the ultraviolet area.

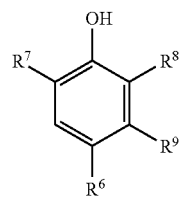

Formula (10)

wherein $R^6$ is hydrogen, an alkyl group having 1 to 5 carbon atoms, or the below-mentioned formula (11):

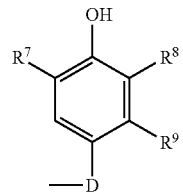

Formula (11)

wherein D in the formula (11) is —S—, an alkylene group having 1 to 10 carbon atoms or an alkylidene group having 1 to 10 carbon atoms. $R^7$ is hydrogen or an alkyl group having 1 to 10 carbon atoms. $R^8$ is hydrogen, an alkyl group having 1 to 10 carbon atoms, or the below-mentioned formula (12):

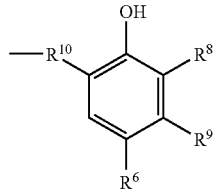

Formula (12)

wherein $R^{10}$ in the formula (12) is an alkylene group having 1 to 10 carbon atoms or an alkylidene group having 1 to 10 carbon atoms. $R^9$ is hydrogen or an alkyl group having 1 to 10 carbon atoms. However, at least one of $R^7$ and $R^8$ is a tert-butyl group, or an alkyl group having a cyclohexyl group. Moreover, substituents of the same numeral can either be same or different.

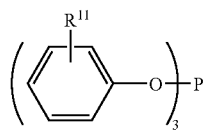

Formula (16)

wherein $R^{11}$ is hydrogen or an alkyl group having 1 to 20 carbon atoms.

By using the above-mentioned specific polymerization initiator and/or polymerization inhibitor, for example, a 3-methoxy butyl acetate solution of a 20% by weight resin solid component prepared by diluting the reaction liquid containing the highly stable resin in a 3-methoxy butyl acetate as it is or dissolving the highly stable resin separated from the reaction liquid placed in a 1 cm square quartz cell shows a 60% or more light, transmittance of a visible area at 400 nm, or a 50% or more light transmittance of an ultraviolet area at 360 nm.

In the case a material polymer having a principal chain including at least a component unit having an acidic functional group and a component unit having a hydroxyl group is reacted with an isocyanate compound having a hardenable reactive group, and is further reacted with an alcohol, a hardenable polymer with a high stability can be obtained. Since a hardenable resin composition is prepared by mixing the hardenable polymer accordingly obtained with other coating materials is not liable to cause the viscosity rise, the coating operation can easily be controlled, and thus the excellent film thickness homogeneity of the coated film can be provided.

In the case the hardenable polymer mixed with other coating materials is dissolved or dispersed in a solvent, the thickening phenomenon is further remarkable compared with a single solution of the hardenable polymer. Therefore, in the case of preparing a hardenable resin composition with the hardenable polymer mixed with other materials, it is particularly preferable to mix the hardenable polymer with other materials after sufficient maturation after the alcohol treatment.

The alcohol to be reacted with the hardenable polymer preferably has a boiling point with a 75° C. or less difference, in particular, 40° C. or less difference with respect to the boiling point of the coating liquid solvent and/or an evaporation rate with a 90[n-BuOAc=100] or less difference, in particular, 30[n-BuOAc=100] or less difference with respect to the evaporation rate of the solvent to be mixed. With the boiling point or the evaporation rate of the alcohol close to that of the coating liquid solvent, the alcohol is evaporated together with the coating liquid solvent even in the case the alcohol remains in the hardenable resin composition, and thus the coating irregularity can hardly be generated.

A hardenable resin composition of the present invention accordingly obtained is suitable for forming a coloring layer of a color filter, a protection film for covering the coloring layer, and a column-like spacer for maintaining the cell gap of a liquid crystal panel, and thus the coloring layer and the protection film with a desired film thickness, and the column-like spacer with a desired height can be formed accurately.

DETAILED DESCRIPTION OF THE PREFERRED EMBODIMENTS

Highly Stable Resin

Figure 1:
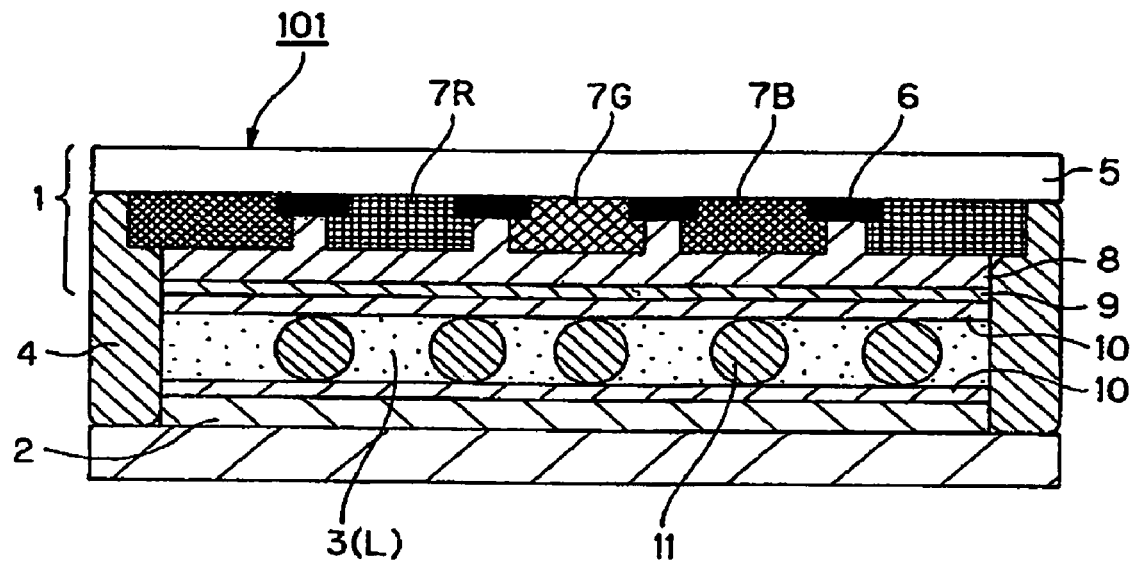
FIG. 1 is a schematic cross-sectional view of an embodiment of a liquid crystal panel.
Figure 2:
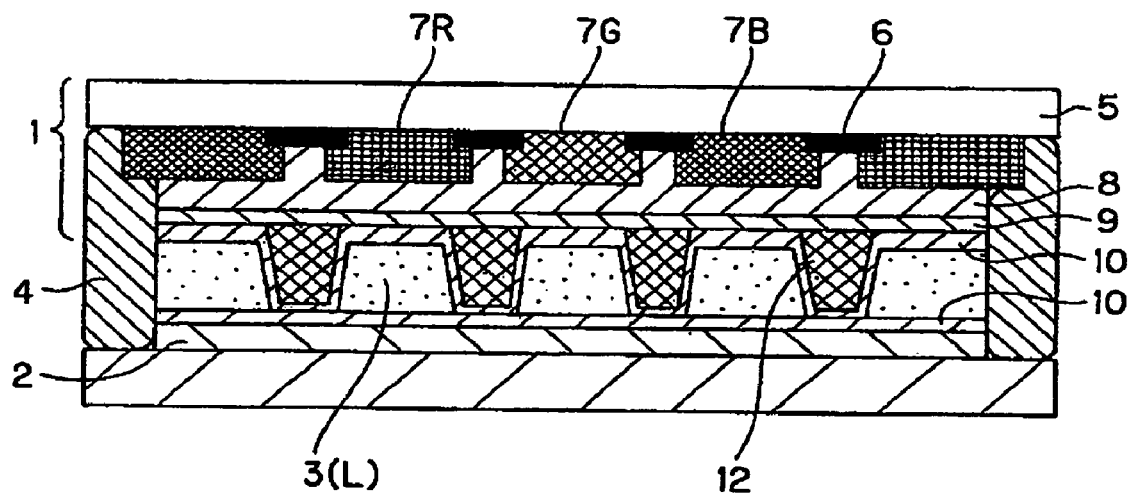
FIG. 2 is a schematic cross-sectional view of another embodiment of a liquid crystal panel.

As an example of a resin capable of improving the stability and prohibiting the thickening phenomenon according to the present invention, a photo-curing copolymer resin having a principal chain comprising at least a component unit represented by the below-mentioned formula (1) and a component unit represented by the below-mentioned formula (2), with at least a part of the carboxyl group or the hydroxyl group included in the component units bonded with a radical polymerizable group-containing isocyanate compound such as a (meth)acryloyloxy alkyl isocyanate represented by the below-mentioned formula (5) according to reaction of the isocyanate group of the compound can be presented. The (meth)acrylic in the present invention denotes either an acrylic group, or a methacrylic group, and the (meth)acryloyl denotes either an acryloyl group, or a methacryloyl group.

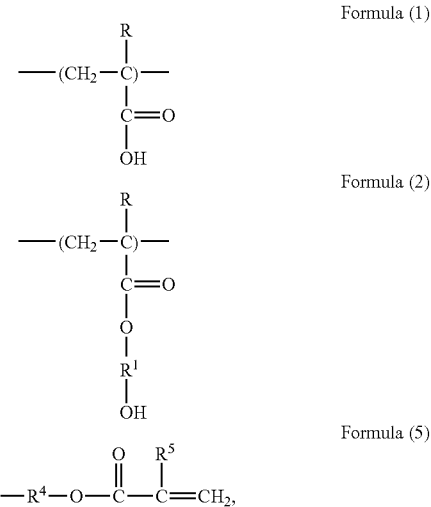

Formula (1)

Formula (2)

Formula (5)

wherein R is hydrogen or an alkyl group having 1 to 5 carbon atoms, $R^1$ is an alkylene group having 2 to 4 carbon atoms, $R^4$ is an alkylene group, and $R^5$ is hydrogen or methyl.

With the copolymer resin presented as an example, the present invention will be explained. The photo-curing copolymer resin preferably contains 5 to 55 mole % of the component unit represented by the formula (1), 5 to 95 mole % of the component unit represented by the formula (2), and 5 to 95 mole % of a radical polymerizable group such as a (meth)acryloyl group, and has 5 to 400 mg KOH/g acidic value, and a 10,000 to 1,000,000 polystyrene-based weight average molecular weight measured by the GPC (gel permeation chromatography).

The photo-curing copolymer resin can further contain 0 to 75 mole % of a component unit represented by the below-mentioned formula (3), and 0 to 75 mole % of a component unit represented by the below-mentioned formula (4) as a copolymer component.

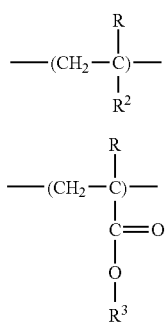

Formula (3)

Formula (4)

wherein R is hydrogen or an alkyl group having 1 to 5 carbon atoms, $R^2$ is an aromatic carbon ring, and $R^3$ is an alkyl group or an aralkyl group.

The copolymer component represented by the formula (1) is a component contributing to the alkaline developing property. The R included in the formula (1) and the other formulae is hydrogen, or an alkyl group having 1 to 5 carbon atoms. Examples of the alkyl group include a methyl group, an ethyl group, an n-propyl group, an isopropyl group, a n-butyl group, an isobutyl group, a sec-butyl group, a tert-butyl group, and a n-pentyl group. As a monomer to be used for introducing the component unit of the formula (1), a compound having a double bond-containing group and a carboxyl group as an acidic functional group can be used. Examples thereof include acrylic acid, methacrylic acid, 2-carboxy-1-butene, 2-carboxy-1-pentene, 2-carboxy-1-hexene, and 2-carboxy-1-heptene. The content of the copolymer component represented by the formula (1) is adjusted according to the alkaline solubility degree demanded to the copolymer resin. In general, it is 5 to 55 mole %, preferably 10 to 25 mole %.

Moreover, the copolymer component represented by the formula (2) is basically a component for introducing a radical polymerizable group therein. The $R^1$ included in the formula (2) is an alkylene group having 2 to 4 carbon atoms. Examples thereof include an ethylene group, a propylene group, and a butylene group. As a monomer used for introducing the component unit represented by the formula (2), a compound having a double bond-containing group and an hydroxyl group can be used. Examples thereof include 2-hydroxy ethyl acrylate, 2-hydroxy ethyl methacrylate, 2-hydroxy propyl acrylate, 2-hydroxy propyl methacrylate, 4-hydroxy butyl acrylate, and 4-hydroxy butyl methacrylate. The copolymer component represented by the formula (2) reacts with a radical polymerizable group-containing isocyanate compound via the hydroxyl group for introducing the radical polymerizable group. The content thereof is adjusted according to the photo polymerization degree demanded to the copolymer resin. The content of the copolymer component represented by the formula (2) is 5 to 95 mole % in general, preferably 10 to 50 mole %.

The above-mentioned photo-curing copolymer resin containing the copolymer component represented by the formula (1) and the copolymer component represented by the formula (2) as the essential component may contain other copolymer components. Examples thereof include the copolymer components represented by the formulae (3) and (4).

The copolymer component represented by the formula (3) is a component for providing the film forming property to the copolymer resin at the time of using the copolymer resin for forming a coated film such as a color filter protection film. $R^2$ is an aromatic carbon ring. Examples thereof include a phenyl group, and a naphthyl group. As a monomer to be used for introducing the component unit represented by the formula (3), a compound having a double bond-containing group and an aromatic carbon ring can be used. Examples thereof include stylene, and α-methyl styrene. Moreover, the aromatic ring thereof can be substituted by a halogen atom such as chlorine and bromine, an alkyl group such as a methyl group and an ethyl group, an amino group such as an amino group, and a dialkyl amino group, cyano group, a carboxyl group, a sulfonic acid group, or a phosphoric acid group. The content of the copolymer component represented by the formula (3) is 0 to 75 mole %, preferably 5 to 50 mole %.

Furthermore, the copolymer component represented by the formula (4) is a component for restraining the alkaline developing property at the time of using the copolymer resin for forming an alkaline developing type color filter protection film. $R^3$ is an alkyl group or an aralkyl group. Examples thereof include an alkyl group a benzyl group, and aralkyl groups such as phenyl ethyl group each having 1 to 12 carbon atoms. As a monomer to be used for introducing the component unit of the formula (4), a compound having a double bond-containing group and an ester group can be used. Examples thereof include esters of (meth)acrylic acid, such as methyl(meth)acrylate, ethyl(meth)acrylate, butyl(meth)acrylate, 2-ethyl hexyl(meth)acrylate, phenyl(meth)acrylate, cyclohexyl(meth)acrylate, dicyclopentanyl(meth)acrylate, dicyclopentanyl oxyethyl(meth)acrylate, isobonyl(meth)acrylate, benzyl(meth)acrylate, and phenyl ethyl(meth)acrylate. The content of the copolymer component represented by the formula (4) is 0 to 75 mole %, preferably 5 to 50 mole %.

The examples of the monomers used for introducing the component units represented by the formulae (1) to (4) can be used alone or as a mixture of two or more per each component unit.

To the principal chain comprising the above-mentioned component units, a radical polymerizable group-containing isocyanate compound is amido-bonded with at least a part of the acidic functional group via an isocyanate group of the isocyanate compound and/or urethane-bonded with at least a part of the hydroxyl group via an isocyanate group of the isocyanate compound, thereby forming a side chain of the radical polymerizable group.

As a radical polymerizable group-containing isocyanate compound to be reacted with a polymer having the component units represented by the formulae (1) to (4), a (meth)acryloyloxy alkyl isocyanate represented by the formula (5) can be used. Among the (meth)acryloyloxy alkyl isocyanates represented by the formula (5), it is preferable to use those having a (meth) acryloyl group bonded with an isocyanate group (—NCO) via an alkylene group having 2 to 6 carbon atoms. Specifically, examples thereof include 2-acryloyloxy ethyl isocyanate, and 2-methacryloyloxy ethyl isocyanate. The 2-methacryloyloxy ethyl isocyanate is available commercially with the product name of "CAREMZ MOI" produced by Showa Denko Corp.

Moreover, the introduction amount of the radical polymerizable group is 5 to 95 mole %, preferably 10 to 50 mole %. With an introduction amount less than 5 mole %, the photo-curing property is low, and thus the effect of improving the coated film adhesion property and the resist characteristics is small.

The above-mentioned photo-curing copolymer resin can be produced by, first, producing a polymer (material polymer) having the component units represented by the formulae (1) to (4), and reacting the same with a radical polymerizable group-containing isocyanate compound.

As a polymerization solvent to be used for producing a polymer having the component units represented by the formulae (1) to (4), a solvent not having active hydrogen, such as a hydroxyl group, and an amino group is preferable. Examples thereof include ethers such as tetrahydro furan, glycol ethers such as diethylene glycol dimethyl ether, diethylene glycol diethyl ether, and diethylene glycol methyl ethyl ether, cellosolve esters such as methyl cellosolve acetate, propylene glycol monomethyl ether acetate, and 3-methoxy butyl acetate. Furthermore, aromatic hydrocarbons, ketones, and esters can also be used.

As a polymerization initiator, those commonly known as a radical polymerization initiator can be used. Specific examples thereof include nitrile-based azo compounds (nitrile-based azo polymerization initiators) such as 2,2'-azobisisobutylonitrile, 2,2'-azobis-(2,4-dimethyl valeronitrile), and 2,2'-azobis-(4-methoxy-2,4-dimethyl valeronitrile); non-nitrile-based azo compounds (non-nitrile-based azo polymerization initiators) such as dimethyl 2,2'-azobis(2-methyl propionate), and 2,2'-azobis(2,4,4-trimethyl pentane); organic peroxides (peroxide-based polymerization initiators) such as t-hexyl peroxy pivalate, tert-butylperoxypivalate, 3,5,5-trimethyl hexanoyl peroxide, octanoyl peroxide, lauroyl peroxide, stearoyl peroxide, 1,1,3,3-tetramethyl butyl peroxy 2-ethyl hexanoate, succinic peroxide, 2,5-dimethyl-2,5-di(2-ethyl hexanoyl peroxy) hexane, 1-cyclohexyl-1-methyl ethyl peroxy 2-ethyl hexanoate, t-hexyl peroxy 2-ethyl hexanoate, 4-methyl benzoyl peroxide, benzoyl peroxide, and 1,1'-bis-(tert-butyl peroxy)cyclohexane; and hydrogen peroxide. In the case a peroxide is used as the radical polymerization initiator, it can be used in a combination with a reducing agent as a redox type polymerization initiator.

In the production of a polymer having the component units represented by the formulae (1) to (4), a molecular weight adjusting agent can be used for adjusting the weight average molecular weight. Examples thereof include hydrocarbon halides such as chloroform, and carbon tetrabromide; mercaptans such as n-hexyl mercaptan, n-octyl mercaptan, n-dodecyl mercaptan, tert-dodecyl mercaptan, and thio glycol; xanthogens such as dimethyl xanthogen disulfide, and diisopropyl xanthogen disulfide; terpinolene, and α-methyl styrene dimer.

A polymer having the component units represented by the formulae (1) to (4) can either be a random copolymer of monomers represented by the formulae (1) to (4), or a block copolymer.

In the case of producing a random copolymer, polymerization can be carried out by dropping a composition including the monomers and a catalyst into a polymerization vessel containing a solvent at a 80 to 110° C. over 2 to 5 hours, and maturation.

It is preferable that the polystyrene-based weight average molecular weight (hereinafter referred to simply as the "weight average molecular weight" or "Mw") of the polymer having the component units represented by the formulae (1) to (4) is in the range from 10,000 to 1,000,000, the acidic value is 5 to 400 mg KOH/g, and the hydroxyl group value is 5 to 400 mg KOH/g.

Reaction of a copolymer having the component units represented by the formulae (1) to (4) with a radical polymerizable group-containing isocyanate compound can be carried out by dropping the isocyanate compound into a solution of the copolymer in the presence of a small amount of a catalyst. As the catalyst, dibutyl tin laurate can be presented. Moreover, a polymerization inhibitor such as p-methoxy phenol, hydro quinone, nathphyl amine, tert-butyl catechol, and 2,3-di-tert-butyl p-cresol can be used as needed.

A part of the radical polymerizable group-containing isocyanate compound is bonded with the component unit represented by the formula (1) in the polymer having the component units represented by the formulae (1) to (4) according to amido-bond by discharging carbon dioxide so that a component unit represented by, for example, the below-mentioned formula (6) is formed. In contrast, it is bonded with the component unit represented by the formula (2) according to urethane-bond by addition reaction so that a component unit represented by, for example, the below-mentioned formula (7) is formed.

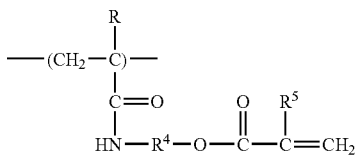

Formula (6)

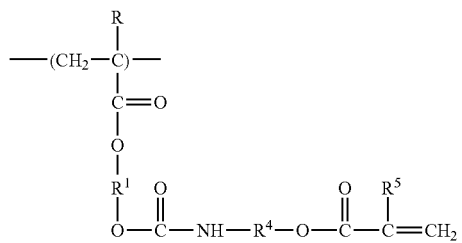

Formula (7)

A photo-curing copolymer resin accordingly obtained has a molecular structure with at least a component unit represented by the formula (1), a component unit represented by the formula (2), a component unit with a radical polymerizable group introduced in a component unit represented by the formula (1), and a component unit with a radical polymerizable group introduced in a component unit represented by the formula (2) interlocked in an optional order.

A radical polymerizable group-containing isocyanate compound has a reaction rate of the reaction with a hydroxyl group in the component unit represented by the formula (2) substantially 20 times as much as that of the reaction with a carboxyl group in the component unit represented by the formula (1). Therefore, the radical polymerizable group is introduced mainly to the component unit represented by the formula (2). And further, even in the case a radical polymerizable group is introduced to a part of the carboxyl group of the component unit represented by the formula (1), most carboxyl groups-remain.

The component unit derived from the formula (2) is contained in the copolymer resin by 5 to 95 mole %. In the content, the part not reacted with the isocyanate compound can be 0 to 10 mole %, and the part with the radical polymerizable group introduced can be 5 to 95 mole %. Moreover, the component unit derived from the formula (1) is contained in the copolymer resin by 5 to 55 mole %. In the content, the part not reacted with the isocyanate compound can be 5 to 55 mole %, and the part with the radical polymerizable group introduced can be 0 to 10 mole %, and thus the introduction amount of the radical polymerizable group can be adjusted over a wide range.

In the case the photo-curing copolymer resin is used for forming a coloring layer of a color filter, a protection film for covering the coloring layer, or a column-like spacer for maintaining the cell gap of a liquid crystal panel, it is preferable that the weight average molecular weight is adjusted in the range from 10,000 to 1,000,000, preferably from 20,000 to 100,000. With a weight average molecular weight less than 10,000, the developing property is so good that the pattern shape at the time of pattern exposure can hardly be controlled, or even in the case a pattern can be produced, a problem of reduction of the final film thickness (film reduction) is involved. In contrast, with a weight average molecular weight more than 1,000,000, the viscosity at the time of providing a resist is so high that the coating suitability is deteriorated, and a problem of the developing property deterioration to hinder the pattern formation is involved.

The acidic value of the copolymer resin is 5 to 400 mg KOH/g, preferably 10 to 200 mg KOH/g. The acidic value is related with the alkaline developing property, and thus if the acidic value is too low, a problem of a poor developing property, or a poor adhesion property onto the substrate and a resin of the color filter is involved. In contrast, if the acidic value is too high, the developing property is so good that a problem of control difficulty of the pattern shape at the time of pattern exposure is involved. The hydroxyl group value in the copolymer can be adjusted in the range from 0 to 200 mg KOH/g. It is not always necessary to keep the hydroxyl group contained in the formula (2), but in the case it is kept, it is effective for adjusting the solubility with respect to a solvent.

Moreover, in the case a coloring layer of a color filter or a protection film for covering the coloring layer is formed, using the photo-curing copolymer resin, a high transparency with respect to the photo-curing copolymer resin is required. In the case a highly transparent photo-curing copolymer resin is needed, it is preferable to carry out the polymerization reaction, using a non-nitrile-based azo polymerization initiator or a peroxide-based polymerization initiator at the time of forming a material polymer, that is, the principal chain part of the photo-curing copolymer resin by reacting a monomer for introducing the component unit represented by the formula (1), a monomer for introducing the component unit represented by the formula (2), and optionally another monomer as needed. As the non-nitrile-based azo or peroxide-based polymerization initiator, the above-mentioned examples can be used.

Furthermore, the transparency of the photo-curing copolymer resin can also be improved by using a specific phenol-based compound or a specific phosphite-based compound as a polymerization inhibitor at the time of reacting the material polymer with the radical polymerizable group-containing isocyanate compound.

That is, the specific phenol-based polymerization initiator capable of improving the transparency of the photo-curing copolymer resin can be represented by the below-mentioned formula (10):

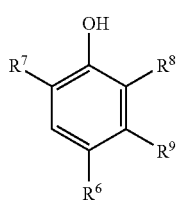

Formula (10)

wherein $R^6$ is hydrogen, an alkyl group having 1 to 5 carbon atoms, or the below-mentioned formula (11):

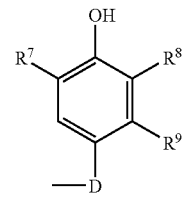

Formula (11)

wherein D in the formula (11) is —S—, an alkylene group having 1 to 10 carbon atoms or an alkylidene group having 1 to 10 carbon atoms. $R^7$ is hydrogen or an alkyl group having 1 to 10 carbon atoms. $R^8$ is hydrogen, an alkyl group having 1 to 10 carbon atoms, or the below-mentioned formula (12):

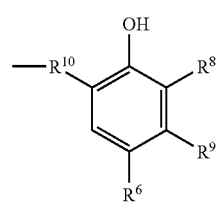

Formula (12)

wherein $R^{10}$ in the formula (12) is an alkylene group having 1 to 10 carbon atoms or an alkylidene group having 1 to 10 carbon atoms. $R^9$ is hydrogen or an alkyl group having 1 to 10 carbon atoms. However, at least one of $R^7$ and $R^8$ is a tert-butyl group, or an alkyl group having a cyclohexyl group. Moreover, substituents of the same numeral can either be same or different.

Among the phenol-based compound represented by the formula (10), those represented by the below-mentioned formulae (13), (14), and (15) are preferable:

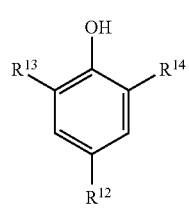

Formula (13)

wherein $R^{12}$ is hydrogen, or an alkyl group having 1 to 5 carbon atoms, and $R^{13}$ and $R^{14}$ are hydrogen or an alkyl group having 1 to 10 carbon atoms. However, at least one of $R^{13}$ and $R^{14}$ is a tert-butyl group, or an alkyl group having a cyclohexyl group.

As a specific example corresponding to the above-mentioned formula (13), 3,5-di-tert-butyl-4-hydroxy toluene (BHT) can be presented.

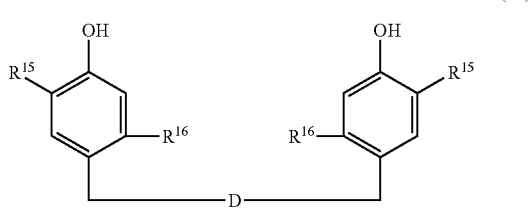

Formula (14)

wherein D is —S—, an alkylene group having 1 to 10 carbon atoms or an alkylidene group having 1 to 10 carbon atoms. $R^{15}$ is hydrogen or an alkyl group having 1 to 10 carbon atoms. $R^{16}$ is hydrogen or an alkyl group having 1 to 10 carbon atoms. However, substituents of the same numeral can either be same or different. At least one of $R^{15}$ is a tert-butyl group, or an alkyl group having a cyclohexyl group.

As a specific example corresponding to the above-mentioned formula (14), 4,4'-thio-bis(3-methyl-6-tert-butyl phenol), and 4,4'-butylidene-bis(3-methyl-6-tert-butyl phenol) can be presented.

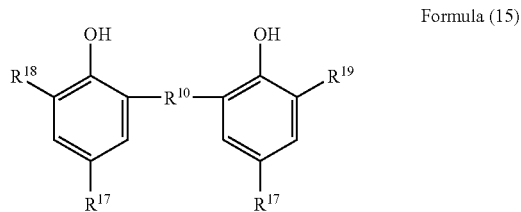

Formula (15)

wherein $R^{10}$ is an alkylene group having 1 to 10 carbon atoms or an alkylidene group having 1 to 10 carbon atoms. $R^{17}$ is hydrogen or an alkyl group having 1 to 5 carbon atoms. $R^{18}$ and $R^{19}$ are hydrogen or an alkyl group having 1 to 10 carbon atoms. However, at least one of $R^{18}$ and $R^{19}$ is a tert-butyl group, or an alkyl group having a cyclohexyl group. Moreover, substituents of the same numeral can either be same or different.

As a specific example corresponding to the above-mentioned formula (15), 2,2'-methylene-bis(4-methyl-6-tert-butyl phenol), 2,2'-methylene-bis(4-ethyl-6-tert-butyl phenol), and 2,2'-dihydroxy-3,3'-di(α-methyl-cyclohexyl)-5,5'-dimethyl diphenyl methane can be presented.

The specific phosphite-based polymerization inhibitor capable of improving the transparency of the photo-curing copolymer resin can be represented by the below-mentioned formula (16):

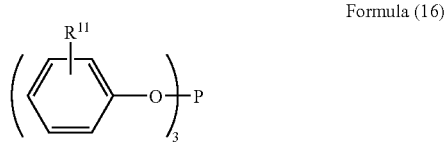

Formula (16)

wherein $R^{11}$ is hydrogen or an alkyl group having 1 to 20 carbon atoms.

As a specific example corresponding to the above-mentioned formula (16), tris(nonylatedphenyl)phosphite can be presented.

In particular, by reacting a material polymer preliminarily produced using the above-mentioned specific polymerization initiator with a radical polymerizable group-containing isocyanate compound using the above-mentioned specific polymerization inhibitor, the excellent transparency can be obtained.

In the case a photo-curing copolymer resin is synthesized using the above-mentioned specific polymerization initiator and/or the above-mentioned specific polymerization inhibitor, since coloring of the obtained reaction liquid is slight, the refining step for eliminating the coloring component from the photo-curing copolymer resin can be simplified or completely eliminated. Therefore, the reaction liquid containing the photo-curing copolymer resin as it is without refining can be used as a coating liquid for forming a pattern required to have the transparency, such as a coloring layer of a color filter or a protection film. For example, the reaction liquid containing the photo-curing copolymer resin of the present invention is diluted in a 3-methoxy butyl acetate as it is or the photo-curing copolymer resin separated from the reaction liquid is dissolved in a 3-methoxy butyl acetate so as to prepare a 3-methoxy butyl acetate solution of a 20% by weight resin solid component. The prepared solution placed in a 1 cm square quartz cell shows the excellent transparency of a 60% or more light transmittance at 400 nm, preferably 70% or more.

This kind of photo-curing resins tend to have the light transmittance lower in the vicinity of 480 nm so as to show the local minimum point of the light transmittance. However, the transparent photo-curing copolymer resin obtained in the present invention does not show the drop of the light transmittance, and has a 85% or more, preferably 90% or more light transmittance in the vicinity of 480 nm under the above-mentioned measurement condition.

The photo-curing copolymer resin obtained in the present invention shows a high light transmittance in the entire area of a visible light. In the measurement under the above-mentioned measurement condition, a 60% or more value is shown in 400 to 700 nm, preferably 70% or more, a 80% or more value is shown in 450 to 700 nm, preferably 85% or more, and a 90% or more value is shown in 500 to 700 nm, preferably 95% or more.

Furthermore, in the case a photo-curing copolymer resin is synthesized, using the above-mentioned specific polymerization initiator and/or the above-mentioned specific polymerization inhibitor, the obtained reaction liquid shows little absorption not only in the visible area but also in the ultraviolet area. Therefore, also in the case of forming a film using the reaction liquid containing the photo-curing copolymer resin as it is as the coating liquid, an ultraviolet ray reaches to the deep part of the film, and thus the exposure sensitivity can be improved. For example, the reaction liquid containing the photo-curing copolymer resin of the present invention is diluted in a 3-methoxy butyl as it is or the photo-curing copolymer resin separated from the reaction liquid is dissolved in a 3-methoxy butyl so as to prepare a 3-methoxy butyl acetate solution of a 20% by weight resin solid component. The prepared solution placed in a 1 cm square quartz cell shows the excellent transparency of a 50% or more light transmittance at 360 nm, preferably 60% or more. Since the wavelength in the vicinity of 360 nm is an effective wavelength of the photo polymerization initiator, in the case the light transmittance in the vicinity of 360 nm is high, the function of the photo polymerization initiator is promoted so that the exposure sensitivity can further be improved.

Since the above-mentioned photo-curing copolymer resin can adjust the content of the alkaline soluble group and the radical polymerizable group in the resin over a wide range, it can be utilized preferably as the effective component of a photo resist. In particular, it is suited for forming a coloring layer of a color filter, a protection film for covering the coloring layer or a column-like spacer for maintaining the cell gap of a liquid crystal panel.

However, if the photo-curing copolymer resin is dissolved or dispersed in a solvent, the molecular amount is increased even in a room temperature so as to rapidly raise the viscosity. If the photo-curing copolymer resin mixed with an epoxy resin, an acrylic monomer, or a polymerization initiator is dissolved or dispersed in a solvent for preparing a photo resist, the degree and the rate of thickening is further remarkable.

Initially, the present inventors considered that a radical polymerizable group such as a (meth)acryloyl group existing in the photo-curing copolymer resin not only relates to the hardening reaction in exposure but also gives rise to the thickening increase in storage. However, according to observation of a solution of the above-mentioned photo-curing copolymer resin by the $^1$H-NMR spectrum, it is confirmed that the double bond amount of the (meth)acryloyl group is not reduced even if the viscosity of the solution rises. Therefore, the radical polymerization group is not the cause of the thickening increase.

Then, the above-mentioned solution of the photo-curing copolymer resin was observed by the FT-IR spectrum (infrared ray absorption spectrum) so that it is confirmed that a minute peak in the vicinity of 1,800 cm$^{-1}$ vanishes according to the viscosity rise. In consideration of the observation result, the FT-IR spectrum of an acrylic anhydride was observed so that a peak was observed at the same position. Moreover, by reacting acetic acid which has a carboxyl group as well as the acrylic acid with a (meth)acryloyloxy ethyl isocyanate, an acid anhydride was obtained.

From these results, the above-mentioned photo-curing copolymer resin is considered to have an acid anhydride group. The acid anhydride group is assumed to be generated as a side product according to dehydration condensation of a part of the component unit represented by the formula (1) in the same molecule as a result of the function of the isocyanate group as a dehydrating agent at the time of producing the photo-curing copolymer resin by reaction of a polymer having at least the component units represented by the formulae (1) and (2) with the radical polymerizable group-containing isocyanate compound. Moreover, by dissolving or dispersing the polymer in a solvent and leaving, the acid anhydride group generated in the molecule of the photo-curing copolymer resin is assumed to react with a hydroxyl group of the component unit represented by the formula (2) contained in another molecule of the photo-curing copolymer resin so as to ester-bond and cross-link the molecules in the photo-curing copolymer resin, resulting in the molecular weight increase and the viscosity rise.

The thickening phenomenon can be prohibited by the alcohol treatment of the above-mentioned photo-curing copolymer resin. For treating the photo-curing copolymer resin with an alcohol, the alcohol can be added to a solution with the above-mentioned photo-curing copolymer resin dissolved or dispersed in a solvent before viscosity rise of the solution or before completion of viscosity rise of the solution. Moreover, it is also possible to polymerize the monomers in a solvent for synthesis such as MBA (3-methoxy butyl acetate, $CH_3CH(OCH_3)CH_2CH_2OCOCH_3$) so as to synthesize a material copolymer having at least the component units represented by the formulae (1) and (2), drop a radical polymerizable group-containing isocyanate compound into a solution of the obtained polymer for reaction, and subsequently add an alcohol to the obtained reaction liquid. The reaction condition at the time of addition is not particularly limited, and the alcohol can be added when the reaction liquid is hot or it is at a room temperature, or can be added into the reaction liquid at on time.

In the case an alcohol is added to the above-mentioned solution of the photo-curing copolymer resin when the acid anhydride group is still unreacted, the alcohol is assumed to compete with the hydroxyl group of the component unit represented by the formula (2) for getting the acid anhydride group so as to esterify the acid anhydride group. As a result, the cross-linking reaction among the photo-curing copolymer resin molecules is prohibited so that the molecular weight increase and the viscosity rise can be prevented.

The molecular structure of the alcohol treatment polymer obtained by adding an alcohol to the above-mentioned photo-curing copolymer resin can be represented by the below-mentioned formula (8):

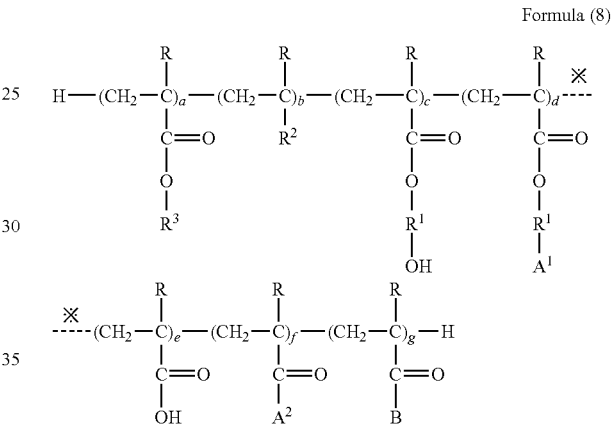

Formula (8)

wherein R, R$^1$, R$^2$ and R$^3$ are same as the above-mentioned, A$^1$ is a residual group of the urethane-bond of the radical polymerizable group-containing isocyanate compound, A$^2$ is a residual group of the amido-bond of the radical polymerizable group-containing isocyanate compound, and B is a residual group of the ester-bond of the alcohol. Moreover, a, b and c denote an integer of 0 or more, and d, e, f and g denote an integer of 1 or more. The component units can either be random-copolymerized, or block-copolymerized.

In the present invention, the reaction with the alcohol should be carried out when a part or the entirety of the acid anhydride groups remains unreacted in the copolymer resin. For example, since the acid anhydride group is not reacted with the hydroxyl group represented by the formula (2) at all immediately after production of the photo-curing copolymer resin by reacting a material polymer having at least the component units represented by the formulae (1) and (2) with the radical polymerizable group-containing isocyanate compound, and thus the viscosity rise is not started, it can be reacted with the alcohol added from the outside. Moreover, even after leaving the solution of the photo-curing copolymer resin at a room temperature for a while, since the unreacted acid anhydride group remains in the case the viscosity rise is still proceeding and not finished completely, the viscosity rise can be prohibited to a certain degree, and thus it is effective.

The kind of the alcohol to be used for prohibiting the thickening phenomenon is not particularly limited, and a compound having an alcoholic hydroxyl group can be used. It can also contain atoms of N, O, S, P, or the like. In general, those having a relatively low molecular weight can easily be handled. For example, those having about 1 to 20 carbon atoms and containing or not containing N, O, S, P, or the like can be presented. More specifically, alcohol-based solvents, such as methanol, ethanol, propanol, butanol, pentanol, hexanol, heptanol, octanol, and decanol; cellosolve-based solvents, such as methoxy alcohol, and ethoxy alcohol; carbitol-based solvents such as methoxy ethoxy ethanol, and ethoxy ethoxy alcohol; ether-based solvents, such as ethylene glycol monomethyl ether, diethylene glycol monomethyl ether, ethylene glycol monopropyl ether, and propylene glycol monomethyl ether; and unsaturated bond-containing solvents, such as 2-hydroxyethyl(meth)acrylate, 2-hydroxypropyl(meth)acrylate, 2-hydroxybutyl(meth)acrylate, 4-pentene-1-ol, tetramethylol methane tri(meth)acrylate, tetratrimethylol propane tri(meth)acrylate, and dipentaerythritol hexaacrylate can be used.

Furthermore, the unreacted alcohol remaining in the solvent of the photo-curing copolymer resin can be eliminated as needed by an appropriate means such as the reprecipitation refining. Moreover, it is also possible to add the alcohol to the solution of the photo-curing copolymer resin, mix the same as it is with other materials in a solvent (a coating solvent) for providing a coating liquid, and evaporate the same with the coating solvent in the drying step after the coating operation. In the case the residual alcohol is evaporated with another solvent as in this example, it is preferable that the difference in terms of the boiling point of the alcohol and the solvent to be mixed, or the difference in terms of the evaporation rate of the alcohol and the solvent to be mixed is as small as possible, and it is ideal that there is no difference. It is further preferable that the difference in terms of the boiling point of the alcohol and the solvent and the difference in terms of the evaporation rate of the alcohol and the solvent are both small. From this viewpoint, the difference in terms of the boiling point of the alcohol and the solvent to be mixed is preferably within 75° C., particularly preferably within 40° C. Furthermore, the difference in terms of the evaporation rate of the alcohol and the solvent to be mixed is preferably within 90[n-BuOAc=100], and particularly preferably within 30[n-BuOAc=100]. It is preferable that both boiling point and evaporation rate of the alcohol satisfy the above-mentioned conditions. The evaporation rate (unit: [n-BuOAc=100]) is represented by the relative evaporation rate with the evaporation rate by the weight method of a normal butyl acetate (n-BuOAc) at 25° C. defined as 100.

The amount of the alcohol to be used for prohibiting the thickening phenomenon is adjusted optionally according to the amount of the acid anhydride group contained in the photo-curing copolymer resin. The amount is preferably about 10 to 120% by weight with respect to the photo-curing copolymer resin.

In order to substantially completely stopping the viscosity rise of the solution of the photo-curing copolymer resin, it is necessary to leave the reaction liquid for a certain time after addition of the alcohol for sufficiently reducing the amount of the acid anhydride group, and maturing the alcohol process polymer. The reaction liquid can be left in a room temperature, but the maturation can be completed in a shorter time by heating. It is preferable that the reaction liquid with the alcohol added is matured by leaving at 30 to 170° C. for a period within 72 hours.

For example, if the maturation time at 90° C. is less than 4 hours, the resin cannot be stabilized completely, and thus the thickening prevention effect is insufficient.

As mentioned above, by adding an alcohol to a solution of a photo-curing copolymer resin having a principal chain including at least a component unit represented by the formula (1) and a component unit represented by the formula (2), with a radical polymerizable group-containing isocyanate compound bonded at least to a part of a carboxyl group or a hydroxyl group contained in the component units via an isocyanate group of the isocyanate compound, the thickening phenomenon can be prohibited so that a highly stable improved resin with a part of the carboxylic acid group of the resin esterified can be obtained.

Furthermore, according to the present invention, by reacting a material polymer including at least a component unit having an acidic functional group and a component unit having a hydroxyl group with an isocyante compound not having a radical polymerizable group, and reacting the obtained polymer with an alcohol, like the above-mentioned case of treating the photo-curing copolymer with an alcohol, the molecular amount increase of the polymer, and the viscosity rise of the solution can be prohibited so that a highly stable resin can be obtained.

By reacting a material polymer including at least a component unit having an acidic functional group and a component unit having a hydroxyl group with an isocyante compound, a polymer with the isocyanate compound amidobonded with at least a part of the acidic functional group via an isocyanate group and/or urethane-bonded with at least a part of the hydroxyl group can be obtained. Like the above-mentioned photo-curing copolymer resin, a polymer having such a molecular structure is considered to provide an acid anhydride group as a side product by dehydration condensation of a part of the acidic functional group in the polymer molecule according to function of the isocyanate compound. If the polymer is dissolved or dispersed in a solvent and left, the cross-linking reaction among the molecules takes place in the same principle as the above-mentioned photo-curing copolymer resin so that the viscosity of the solution rises.

Moreover, in the case an alcohol is reacted with a solution of a polymer having such a molecular structure, like the above-mentioned case of the alcohol treatment of the photo-curing copolymer resin, by the ester-bond according to the addition reaction of the alcohol to the part of the acid anhydride group so as to prevent the cross-linking reaction, the molecular amount increase of the polymer and the viscosity rise of the solution can be prohibited consequently.

As the acidic functional group bonded directly or indirectly with the principal chain of the material polymer, those capable of forming an acid anhydride group by dehydration condensation can be subjected to the present invention. For example, also in the case of those having an acidic functional group other than a carboxyl group, such as a phosphoric acid group, a sulfonic acid group, and a sulfinic acid group, the alcohol treatment is effective.

Furthermore, as an isocyanate compound to be reacted with the material polymer, those not having a reactive group other than the isocyanate group, or those having the isocyanate group and another reactive group can be used optionally according to the application of the polymer. In the case of producing a hardenable polymer, for example, an isocyanate compound having the photo-curing reactive group or a thermosetting reactive group is used. As the photo-curing reactive group, a radical polymerizable group such as a (meth)acryloyl group can be introduced into the isocyanate compound as mentioned above.

In the case a highly stable resin is required to have the excellent transparency in the visible area or the excellent light transmittance in the ultraviolet area, like the above-mentioned case of producing a photo-curing copolymer resin, it is preferable to use a non-nitrile-based azo or peroxide-based polymerization initiator, or to use a phenol-based polymerization inhibitor represented by the above-mentioned formula (10) or a phosphite-based polymerization inhibitor represented by the above-mentioned formula (16). That is, by carrying out the polymerization reaction using a non-nitrile-based azo polymerization initiator or a peroxide-based polymerization initiator at the time of forming a material polymer, that is, the principal chain part of a highly stable resin by reacting a monomer having a double bond-containing group and an acidic functional group, a monomer having a double bond-containing group and a hydroxyl group, and optionally another monomer as needed, the transparency and the ultraviolet ray transmittance of the obtained reaction liquid can be improved. Moreover, also by using a polymerization inhibitor selected from the group consisting of compounds represented by the above-mentioned formulae (10) and (16) at the time of reacting the material polymer with an isocyanate compound, the transparency and the ultraviolet ray transmittance of the obtained reaction liquid can be improved. Similarly, by reacting a material polymer preliminarily produced using the above-mentioned non-nitrile-based azo or peroxide polymerization initiator with an isocyanate compound using the above-mentioned polymerization inhibitor, particularly preferable transparency and ultraviolet ray transmittance can be obtained. Polymerization reaction for synthesizing a material polymer, and reaction for introducing an isocyanate compound to a material polymer can be executed with the same condition as in the above-mentioned case of producing a photo-curing copolymer resin.

By preparing a polymerization intermediate using the above-mentioned polymerization initiator and/or the above-mentioned polymerization inhibitor, and by being applied with alcohol treatment, a highly stable resin having the excellent transparency and ultraviolet ray transmittance can finally be obtained. For example, the reaction liquid applied with the alcohol treatment is diluted in a 3-methoxy butyl acetate as it is or the highly stable resin separated from the reaction liquid is dissolved in a 3-methoxy butyl acetate so as to prepare a 3-methoxybutyl acetate solution of a 20% by weight resin solid component. The prepared solution placed in a 1 cm square quartz cell shows the excellent transparency of a 60% or more light transmittance at 400 nm in the visible area, preferably 70% or more, or a 50% or more light transmittance in the ultraviolet area, preferably 60% or more.

A polymerization intermediate obtained by reacting a material polymer with an isocyanate compound can be applied with the alcohol treatment in the same procedure as in the above-mentioned case of the photo-curing copolymer. That is, by adding an alcohol to a reaction liquid obtained by the reaction of the material polymer and the isocyanate compound, or a solution obtained by dissolving or dispersing the polymer refined from the reaction liquid again in a solvent before viscosity rise or before completion of viscosity rise, a highly stable polymer can be obtained. Moreover, the polymer applied with the alcohol treatment is left or heated for a predetermined time for maturation as needed.

The alcohol treated polymer thus obtained has a molecular structure with a principal chain including at least a component unit having an acidic functional group and a component unit having a hydroxyl group, wherein an isocyanate compound is amido-bonded with at least a part of the acidic functional group via an isocyanate group of the isocyanate compound and/or urethane-bonded with at least a part of the hydroxyl group via an isocyanate group of the isocyanate compound, and an alcohol is ester-bonded with at least a part of the acidic functional group via a hydroxyl group of the alcohol. The molecular structure can be represented by the below-mentioned formula (9):

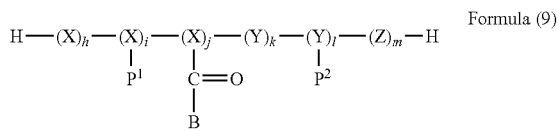

wherein X is a component unit having an acidic functional group, Y is a component unit having a hydroxyl group, Z is another component unit, $P^1$ is a residual group of the amido-bonded isocyanate compound, $P^2$ is a residual group of the urethane-bonded isocyanate compound, and B is a residual group of the ester-bonded alcohol. Moreover, k, m are an integer of 0 or more, and h, i, j, l are an integer of 1 or more.

Hardenable Resin Composition

After reacting a material polymer having a principal chain including at least a component unit having an acidic functional group and a component unit having a hydroxyl group with an isocyanate compound having a hardenable reactive group such as a photo-curing group or a thermosetting group, by further reacting the same with an alcohol, a hardenable polymer with a high stability can be obtained. Various hardenable polymers can be obtained depending on the kind of the hardenable group to be introduced into the isocyanate compound. The above-mentioned alcohol treated photo-curing copolymer resin is also a highly stable hardenable polymer.

Since viscosity rise is not liable if a hardenable resin composition is prepared by mixing a hardenable polymer obtained in the present invention with another coating material, the coating operation can be controlled easily and the film thickness homogeneity of the coated film can be excellent.

In the case of producing a photo-curing resin composition, a photo polymerizable monomer such as a polyfunctional acrylic-based monomer having two or more functional groups, a polymerization initiator, or the like, can be dissolved and dispersed in a resist solvent (coating solvent for dilution) with a photo-curing polymer as the main polymer.

In the case of forming a coloring layer of a color filter, a protection film, and a column-like spacer of a liquid crystal panel, an alcohol treatment photo-curing polymer represented by the above-mentioned formula (8) can be used as the main polymer.

The photo-curing polymer is contained in the photo-curing resin composition in the present invention, in general, by 5 to 80% by weight by the solid component ratio, preferably by 10 to 50% by weight. With a content of the photo-curing polymer more than 80% by weight, the viscosity is too high, and consequently the flowability may be lowered so as to deteriorate the application property. Moreover, with a content of the photo-curing polymer less than a 5% by weight, the viscosity is too low, and consequently the coated film stability after application and drying is insufficient so that a problem of deteriorating the exposure and developing suitability may be generated.

As a polyfunctional acrylic-based monomer to be contained in a photo-curing resin composition as a photo polymerization monomer, for example, ethylene glycol (meth) acrylate, diethylene glycol di(meth)acrylate, propylene glycol di(meth)acrylate, dipropylene grlycol di(meth)acrylate, polyethylene glycol di(meth)acrylate, polypropylene glycol di(meth)acrylate, hexane di(meth)acrylate, neopentyl glycol di(meth)acrylate, glycerol di(meth)acrylate, glycerol tri(meth)acrylate, glycerol tetra(meth)acrylate, tetra trimethylol propane tri(meth)acrylate, 1,4-butane diol diacrylate, pentaerythritol triacrylate, trimethylol propane triacrylate, pentaerythritol (meth)acrylate, and dipentaerythritol hexa(meth)acrylate can be presented. These components can be used alone or as a mixture thereof.

It is preferable that the polyfunctional acrylate-based monomer contains at least one kind of a monomer having three or more functional groups, and the content thereof is about 30 to 95% by weight in the polyfunctional acrylate-based monomer. Moreover, to the polyfunctional acrylate-based monomer, a monofunctional monomer such as methyl (meth)acrylate, ethyl(meth)acrylate, propyl(meth)acrylate, butyl (meth)acrylate, pentyl(meth)acrylate, ethylhexyl (meth)acrylate, styrene, methyl styrene, and N-vinyl pyrrolidone can be added as a reaction diluting agent.

The content of the polyfunctional acrylate-based monomer as a photo polymerizable monomer in the photo-curing resin composition is 3 to 50% by weight, preferably 5 to 40% by weight by the solid component ratio. With the polyfunctional acrylate-based monomer by less than 3% by weight, a problem arises in that the physical strengths of the film to be formed, such as the bonding strength, and the heat resistance are insufficient. In contrast, with a ratio more than 50% by weight, the stability of the photo-curing resin composition is deteriorated as well as the flexibility of the film to be formed is insufficient. Furthermore, the ratio is important also for improving the dissolving characteristics with respect to the developing liquid. In the case it is outside the range of the optimum amount, even though the pattern resolution is possible, the monomer hardening rate is high so that the scum and the beard are generated in the periphery of the pattern. Moreover, at the outside the above-mentioned range, in a terrible case, resist re-adhesion derived from partial swelling and peel-off is generated so as to inhibit the accurate pattern formation.

Furthermore, in the photo-curing resin composition according to the present invention, a compound having two or more epoxy groups in molecule (epoxy resin) can be included as needed for improving the heat resistance, the adhesion property, the chemical resistance (in particular, the alkaline resistance). Examples of the compound having two or more epoxy groups in a molecule include bisphenol A type epoxy resins, such as Epi Coat 1001, 1002, 1003, 1004, 1007, 1009, and 1010 (produced by Yuka Shell Corp.), bisphenol F type epoxy resins, such as Epi Coat 807 (produced by Yuka Shell Corp.), phenol novolak type epoxy resins, such as EPPN 201, 202 (produced by Nihon Kayaku Corp.), and Epi Coat 154 (produced by Yuka Shell Corp.), and cresol novolak type epoxy resins, such as EOCN 102, 103S, 104S, 1020, 1025, 1027 (produced by Nihon Kayaku Corp.), and Epi Coat 180S (produced by Yuka Shell Corp.). Furthermore, cyclic aliphatic epoxy resin and aliphatic polyglycidyl ethers can be presented as well.

Among these examples, the bisphenol A type epoxy resins, the bisphenol F type epoxy resins, the phenol novolak type epoxy resins, and the cresol novolak type epoxy resins are preferable. Although most of the compounds having two or more epoxy groups in a molecule have a high molecular weight, the glycidyl ethers such as bisphenol A and bisphenol F have a low molecular weight, and those having a low molecular weight are particularly preferable. Moreover, an acrylic copolymer including glycidyl(meth)acrylate, oxetane (meth)acrylate, alicyclic epoxy(meth)acrylate, or the like, in a resin skeleton is also effective.

The epoxy resin is contained in the photo-curing resin composition, in general, by 0 to 60% by weight, preferably 5 to 40% by weight by the solid component ratio. With a less than 5% by weight epoxy resin content, the sufficient alkaline resistance may not be applied to the protection film. In contrast, with a more than 40% by weight epoxy resin content, the epoxy resin amount not contributing to the photo curing is too large so that the storage stability and the developing suitability of the photo-curing resin composition are deteriorated, and thus it is not preferable. Moreover, the epoxy resin is effective also for eliminating the tack of the dried coated film of the photo-curing resin composition, and a sufficient effect can be provided with about 3% by weight addition amount. The epoxy resin reacts with an acidic group still remaining in the coated film without reacting even after exposure and alkaline development, by heat treatment so as to provide the excellent alkaline resistance to the coated film.

As a polymerization initiator, a radical polymerizable initiator can be used. The radical polymerization initiator is a compound for generating a free radical, for example, by the ultraviolet ray energy. Examples thereof include benzophenone derivatives such as benzoin, and benzophenone, or derivatives such as esters thereof; xantone and thioxantone derivatives; halogen-containing compounds such as chlorosulfonyl, chloromethyl polynuclear aromatic compounds, chrloromethyl heterocyclic compounds, and chloromethyl benzophenone; triadines; fluorenones; haloalkanes; redox couples of a photo reducing pigment and a reducing agent; organic sulfur compounds; and peroxides. Preferably, ketone-based and biimidazol-based compounds, such as Irgacure 184, Irgacure 369, Irgacure 651, Irgacure 907 (produced by Chiba Specialty Chemicals Corp.), Darocure (produced by Merc Corp.), Adeka 1717 (produced by Asahi Denka Kogyo Corp.), and 2,2'-bis(o-chloro phenyl)-4,5,4'-tetra phenyl-1,2'-biimidazol (produced by Kurogane Kasei Corp.) can be presented. The initiators can be used alone or in a combination of two or more. In the case of using two or more, it is preferable not to prohibit the absorption spectrum characteristics.

The radical polymerization initiator is contained in the photo-curing resin composition by, in general, 0.1 to 20% by weight, preferably 1 to 15% by weight by the solid component ratio. With a less than 0.1% by weight radical polymerization initiator addition amount, the photo-curing reaction is not proceeded so that the residual film ratio, the heat resistance, and the chemical resistance tend to be lowered. Moreover, with a more than 20% by weight addition amount, the solubility to the base resin is saturated so that crystals of the initiator are precipitated at the time of spin coating or coated film leveling so as not to maintain the homogeneity of the film surface, and thus a problem of the film ruggedness generation is involved.

In adjusting the photo-curing resin composition, the polymerization initiator may be added initially to the resin composition including the above-mentioned polyfunctional acrylate-based monomer and the hardenable polymer, but in the case of a relatively long term storage, it is preferable to disperse or dissolve the same in the resin composition immediately before use.

In the case improvement of the light sensitivity is required, a sensitizer may be added. As the sensitizer to be used, a styryl-based compound or a courmarin-based compound is preferable. Specifically, 2-(p-dimethyl amino styryl) quinoline, 2-(p-diethyl amino styryl) quinoline, 4-(p-dimethyl amino styryl) quinoline, 4-(p-diethyl amino styryl) quinoline, 2-(p-dimethyl amino styryl)-3,3-3H-indol, 2-(p-diethyl amino styryl)-3,3-3H-indol, 2-(p-dimethyl amino styryl)benzoxazol, 2-(p-diethyl amino styryl)-benzoxazol, 2-(p-dimethyl amino styryl)benzimidazol, and 2-(p-diethyl amino styryl)-benzimidazol can be presented.

Moreover, as the courmarin-based compounds, 7-diethyl amino-4-methyl courmarin, 7-ethyl amino-4-trifluoro methyl courmarin, 4,6-diethyl amino-7-ethyl amino courmarin, 3-(2-benzimidazolyl)-7-N,N-diethyl amino courmarin, 7-diethyl amino cyclopenta(c) courmarin, 7-amino-4-trifluoro methyl courmarin, 1,2,3,4,5,3H,6H,10H-tetrahydro-8-trifluoro methyl (1) benzopyrrano-(9,9a,1-gh)-quinolidine-10-on, 7-ethyl amino-6-methyl-4-trifluoro methyl courmarin, and 1,2,3,4,5,3H,6H,10H-tetrahydro-9-carbethoxy(1) benzopyrrano-(9,9a,1-gh)-quinolidine-10-on can be presented.

To the above-mentioned photo-curing resin composition, various additives, such as the below-mentioned surfactants and silane coupling agents can be added as needed.

The surfactants are added to the photo-curing resin composition for ensuring the coating suitability, and the film flatness after drying. Examples thereof include polyoxy ethylene alkyl ethers such as polyoxy ethylene lauryl ether, polyoxy ethylene stearyl ether, and polyoxy ethylene oleyl ether, polyoxy ethylene aryl alkyl ethers such as polyoxy ethylene octyl phenyl ether, and polyoxy ethylene nonyl phenyl ether, polyoxy ethylene dialkyl esters such as polyoxy ethylene dilaurate, and polyoxy ethylene distearate, and fluorine-based surfactants such as Megafac F171, 172, 173 (produced by Dainippon Ink Corp.), Florade FC430, 431 (produced by Sumitomo 3M Corp.), Asahi Guard AG710, Surflone S-382, SC-101, 102, 103, 104, and 105(Asahi glass Corp.) The content of the surfactant is preferably 2 parts by weight or less with respect to 100 parts by weight of the solid component of the photo-curing resin composition, and more preferably 1 part by weight or less.

Moreover, the silane coupling agents are added for improving the adhesion property to the adjacent substrates or another coating layer. For example, vinyl silanes, acrylic silanes, epoxy silanes, and amino silanes can be presented. More specifically, as a vinyl silane, vinyl trichlorsilane, vinyl tris (β-methoxy ethoxy) silane, vinyl triethoxy silane, vinyl trimethoxy silane, or the like, can be used. Furthermore, as an acrylic silane, γ-methacryloxy propyl trimethoxy silane, γ-methacryloxy propyl methyl dimethoxy silane, or the like, can be used. As an epoxy silane, β-(3,4-epoxy cyclo hexyl) ethyl trimethoxy silane, γ-glycidoxy propyl trimethoxy silane, γ-glycidoxy propyl methyl diethoxy silane, or the like, can be used. Furthermore, as an amino silane, N-β-(amino ethyl)-γ-amino propyl trimethoxy silane, N-β-(amino ethyl)-γ-amino propyl methyltrimethoxy silane, γ-amino propyl triethoxy silane, N-phenyl-γ-amino propyl trimethoxy silane, or the like, can be used. As other silane coupling agents, γ-mercaptopropyl trimethoxy silane, γ-chloropropyl trimethoxy silane, γ-chloropropyl methyl dimethoxy silane, γ-chloro propyl methyl diethoxy silane, or the like, can be used.

In the present invention, in general, a solvent is contained in the above-mentioned photo-curing resin composition or another hardenable resin composition in consideration of preparation of a paint and the coating suitability. As a usable solvent, for example, organic solvents including alcohol-based solvents such as methyl alcohol, ethyl alcohol, N-propyl alcohol, and i-propyl alcohol; cellosolve-based solvents such as methoxy alcohol, and ethoxy alcohol; carbitol-based solvents such as methoxy ethoxy ethanol, and ethoxy ethoxy ethanol; ester-based solvents such as ethyl acetate, butyl acetate, methyl methoxy propionate, ethyl ethoxy propionate, and ethyl lactate; ketone-based solvents such as acetone, methyl isobutyl ketone, and cyclo hexanone; cellosolve acetate-based solvents such as methoxy ethyl acetate, ethoxy ethyl acetate, and ethyl cellosolve acetate; carbitol acetate-based solvents such as methoxy ethoxy ethyl acetate, and ethoxy ethoxy ethyl acetate; ether-based solvents such as diethyl ether, ethylene glycol dimethyl ether, diethylene glycol dimethyl ether, and tetrahydro furan; non-protonic amido solvents such as N,N-dimethyl formamido, N,N-dimethyl acetoamido, and N-methylpyrrolidone; lactone-based solvents such as γ-butylolactone; unsaturated hydrocarbon-based solvents such as benzene, toluene, xylene, and naphthalene; and saturated hydrocarbon-based solvents such as N-heptane, N-hexane, and N-octane can be presented. Among these solvents, cellosolve acetate-based solvents such as methoxy ethyl acetate, ethoxy ethyl acetate, and ethyl cellosolve acetate; carbitol acetate-based solvents such as methoxy ethoxy ethyl acetate, and ethoxy ethoxy ethyl acetate; ether-based solvents such as ethylene glycol dimethyl ether, diethylene glycol dimethyl ether, and propylene glycol diethyl ether; and ester-based solvents such as methyl methoxy propionate, ethyl ethoxy propionate, and ethyl lactate can be used particularly preferably. Particularly preferably, MBA (3-methoxy butyl acetate, $CH_3CH(OCH_3)CH_2CH_2OCOCH_3$), PGMEA (propylene glycol monomethyl ether acetate, $CH_3OCH_2CH(CH_3)OCOCH_3$), DMDG (diethylene glycol dimethyl ether, $H_3COC_2H_4OCH_3$), or a mixture thereof can be used. The solid component concentration is adjusted to 5 to 50% by weight, using these solvents.

As a method for producing a highly stable photo-curing resin composition, first, monomers are reacted in a solvent for synthesis (a synthesis solvent) such as the above-mentioned MBA (3-methoxy butyl acetate) to synthesize a material polymer. Then, a radical polymerizable group-containing isocyanate compound is dropped into a solution of the obtained material polymer for reaction so as to produce a photo-curing polymer. In the case the transparency of the resin is particularly required, the material polymer is produced using a non-nitrile-based azo polymerization initiator or a peroxide-based polymerization initiator as well as a radical polymerizable group-containing isocyanate compound is introduced using a polymerization inhibitor selected from the group consisting of the compounds represented by the above-mentioned formulae (10) and (16). Then, an alcohol is added to a reaction liquid containing the photo-curing polymer, and the photo-curing polymer applied with the alcohol treatment is maturated by, for example, heating at 30 to 170° C. within 72 hours. The reaction liquid is mixed with a resist solvent such as MBA, PGMEA, and DMDG with other resist materials. The solid component concentration in the photo-curing resin composition is in general, in the range of 5 to 85% by weight.

In the case a hardenable polymer mixed with another coating material is dissolved or dispersed in a solvent, the thickening phenomenon is further remarkable compared with the case of a solution of the hardenable polymer alone. Therefore, in the case of preparing a hardenable resin composition with a hardenable polymer mixed with another material, it is particularly preferable to mix the hardenable polymer with the other material after sufficient maturation by leaving or heating for a predetermined time after the alcohol treatment.

It is preferable that the alcohol to be reacted with the hardenable polymer has a boiling point or an evaporation rate close to that of the solvent for preparing a coating liquid. It is more preferable that both boiling point and evaporation rate are close to those of the coating liquid solvent. More specifically, it is preferable that the difference of the alcohol boiling point and the coating liquid solvent boiling point is within 75° C., in particular, within 40° C., and/or the difference of the alcohol evaporation rate and the coating liquid solvent evaporation rate is within 90-[n-BuOAc=100], in particular, within 30-[n-BuOAc=100]. In the case the boiling point or the evaporation rate of the alcohol is close to that of the coating liquid solvent, since the alcohol is evaporated together with the coating liquid solvent even if the alcohol remains in the hardenable resin composition, the coating irregularity can hardly be generated. Since pentanol has a boiling point and an evaporation rate close to those of PGMEA and DMDG, it is preferable to prepare a hardenable resin composition by applying alcohol treatment of the polymer with pentanol, and using MBA, PGMEA, DMDG, or a mixture thereof as a resist solvent. Since the pentanol has a boiling point and an evaporation rate also close to those of MBA, it is further preferable to prepare a hardenable resin composition by using MBA as the synthesis diluting solvent, applying alcohol treatment using pentanol, and further using MBA, PGMEA, DMDG or a mixture thereof as a resist solvent.

Color Filter and Liquid Crystal Panel

The above-mentioned photo-curing resin composition applied with the alcohol treatment is suited for forming a coloring layer of a color filter, a protection film for covering the coloring layer, and a column-like spacer for maintaining the cell gap of a liquid crystal panel.

A color filter comprises a black matrix formed with a predetermined pattern on a transparent substrate, a coloring layer formed with a predetermined pattern on the black matrix, and a protection film formed so as to cover the coloring layer. A transparent electrode for driving liquid crystals can be formed on the protection film as needed. Moreover, a column-like spacer may be formed on the transparent electrode plate, the coloring layer, or the protection layer, coinciding with the area with the black matrix layer formed.

The coloring layer has red pattern, a green pattern and a blue pattern disposed in a desired form, such as the mosaic type, the stripe type, the triangular type, and the four pixel arrangement type, and the black matrix is provided between the coloring patterns and a predetermined area outside the coloring layer formation area. Although the coloring layer can be formed by various methods, it is preferable to form by the pigment dispersion method using the above-mentioned hardenable resin composition. That is, a coloring layer can be formed by dispersing a coloring pigment in the above-mentioned hardenable resin composition for preparing a coating material, applying the same on one surface side of a transparent substrate, exposing the same by the ultraviolet ray radiation via a photo mask, alkaline development, and heat-curing by a clean oven, or the like. The coloring layer is formed, in general, in about 1.5 µm thickness.

The black matrix can be formed by either of the dye method, the pigment dispersion method, the printing method, and the electrochemical deposition method. Furthermore, it can be formed also by chromium deposition, or the like.

The protection film can be formed by applying a coating liquid of the above-mentioned photo-curing resin composition by means of a spin coater, a roll coater, spraying, printing, or the like. The protection film is formed, for example, in about 2 µm thickness. In the case a spin coater is used, the rotational frequency is set in the range of 500 to 1,500 rotation/minute. The coated film of the photo-curing resin composition is exposed by the ultraviolet ray radiation via a photo mask, alkaline-developed, and heat-cured by a clean oven so as to provide a protection film.

The transparent electrode on the protection film is formed using tin indium oxide (ITO), zincoxide (ZnO), tin oxide (SnO), or an alloy thereof by a common method such as the sputtering method, the vacuum deposition method, and the CVD method, with a predetermined pattern formed by etching with a photo resist or use of a jig as needed. The thickness of the transparent electrode can be about 20 to 500 nm, preferably about 100 to 300 nm.

The column-like spacer on the transparent electrode can be formed also by applying a coating liquid of the above-mentioned photo-curing resin composition by means of a spin coater, a roll coater, spraying, printing, or the like, exposing the same by the ultraviolet ray radiation via a photo mask, alkaline development, and heat-curing by a clean oven. The column-like spacer is formed, for example, in about 5 µm height. Like the case of forming the protection film, the rotational frequency of the spin coater can be set in the range of 500 to 1,500 rotation/minute.

A liquid crystal panel can be obtained by forming an alignment layer on the inner surface side of the color filter accordingly produced, facing the same to an electrode substrate, and filling a liquid crystal in the gap part and sealing.

EXAMPLES

Example 1

Production of a Photo-Curing Polymer

A solution prepared by dissolving benzyl methacrylate, styrene, acrylic acid, and 2-hydroxy ethyl methacrylate of the below-mentioned amounts in 650 g of 3-methoxy butyl acetate with 5 g of azo bis isobutylonitrile was dropped into a polymerization vessel containing 1,000 g of 3-methoxy butyl acetate at 100° C. over 6 hours for polymerization so as to obtain a solution of a material polymer.

Benzyl methacrylate: 250 g (15.6 mole %)
Styrene: 350 g (37.0 mole %)
Acrylic acid: 200 g (30.5 mole %)
2-hydroxy ethyl methacrylate: 200 g (16.9 mole %)

Then, a mixture of the below-mentioned composition was dropped into the obtained material polymer solution over 5 hours. The addition amount of 2-methacryloyloxy ethyl isocyanate corresponds to 16.9 mole % with respect to 100 mole % of a monomer composition (hereinafter referred to as the copolymer composition) comprising benzyl methacrylate/styrene/acrylic acid/2-hydroxy ethyl methacrylate.

2-methacryloyloxy ethyl isocyanate: 240 g
dibutyl tin laurate: 1 g
3-methoxy butyl acetate: 2,260 g
hydro quinone: 2.5 g While monitoring process of reaction by the IR (infrared ray absorption spectrum), the reaction was executed until the peak of the 2,200 $cm^{-1}$ isocyanate group was vanished.

The obtained reaction liquid has a 25.5% by weight solid component, and a 77.3 mPa·s/25° C. viscosity. After applying the obtained polymer solution on a glass plate, it was dried in a reduced pressure at a room temperature over a night for eliminating the solvent. The obtained solid has a 125.5 mg KOH/g acidic value, and a 42,500 weight average molecular weight.

The physical properties were measured by the below-mentioned method.

a. Solid component: 0.7 to 0.8 g of a polymer solution measured accurately was placed in an aluminum plate, and dried at 105° C. for 6 to 7 hours by a hot air drier. The accurate weight was measured immediately for finding the ratio of the measured dried weight with respect to the polymer solution weight.

b. Viscosity (mPa·s/25° C.): With a rotor No. 1 used, the viscosity was measured by a B type viscometer at 60 rpm.

c. Acidic vale: The acidic value was found by dissolving a specimen in an acetone, and the neutralization titration by NaOH of 1/10 N with a cresol red used as an indicator.

d. Hydroxyl group value: The hydroxyl group value was found from the KOH weight necessary for neutralizing an acidic value capable of acetylating 1 g of a dried polymer.

e. Weight average molecular weight: GPC measurement condition and column are as follows.

Column: Schodex GPC KF-805L (produced by Showa Denko Corp.)
Flow rate: 1.0 (ml/min)
Temperature: 40° C.
Eluent: Tetrahydrofuran
Detector: RI <Alcohol Treatment>

1-pentanol was added to the obtained reaction liquid (3-methoxy butyl acetate solution of a 25.5% by weight solid component) by a 10% by weight ratio, followed by maturation. A part of the reaction liquid added with the 1-pentanol was heated and agitated at 90° C. for 11 hours for maturation. Moreover, another part was heated and agitated at 70° C. for 30 hours for maturation. After completing the maturation, it was confirmed by the FT-IR spectrum that the area ratio represented by the acid anhydride group [1,783 to 1,822 cm$^{-1}$]/benzene ring [683 to 721 cm$^{-1}$] became 0.03 or less.

<Storage Test>

The viscosity of the above-mentioned reaction liquid obtained by dropping 2-methacryloyloxy ethyl isocyanate was measured by a B type viscometer. It was 77.3 mPa·s/25° C. (25.5% by weight solid component concentration) immediately after finishing the reaction, and was 49.5 mPa·s/25° C. (23.2% by weight solid component concentration) in the reaction liquid applied with the alcohol treatment. Furthermore, the reaction liquid and the reaction liquid applied with the alcohol treatment were refrigerated, stored in a room temperature, and at a high temperature. Results are shown in the below-mentioned table.

TABLE 1

|  | Alcohol treated reaction liquid | Unreacted reaction liquid |
|---|---|---|
| Refrigeration storage (2 weeks) | 1.001 times | 1.011 times |
| Room temperature storage (2 weeks) | 1.008 times | 1.172 times |
| Heat storage (70° C., 1.5 days) | 1.020 times | 1.500 times |

Example 2

<Preparation of a Photo-Curing Resin Composition (1)>

A photo-curing resin composition (1) was obtained by agitating and mixing the materials of the below-mentioned amounts at a room temperature.

Reaction product applied with the alcohol treatment obtained in the Example 1 (23.2% by weight solid component): 590 parts by weight Dipentaerythritol pentaacrylate (produced by Thertomer Corp., SR399): 11.0 parts by weight Orthocresol novolak type epoxy resin (produced by Yuka Shell Epoxy Corp., Epi Coat 180S70): 15 parts by weight 2-methyl-1-(4-methyl thio phenyl)-2-morfolyno propanone-1: 2.1 parts by weight 2,2'-bis(o-chrolo phenyl)-4,5,4',5'-tetra phenyl-1,2'-biimidazol: 1.5 parts by weight Diethylene glycol dimethyl ether: 59.0 parts by weight 3-methoxy butyl acetate: 7.4 parts by weight Example 3

Formation of a Black Matrix

The components by the below-mentioned amounts were mixed, and dispersed by means of a sand mill for preparing a black pigment dispersion liquid.

Black pigment: 23 parts by weight

Polymer dispersing agent (produced by Bic Chemie Japan, Corp., Disperbyk 111): 2 parts by weight Solvent (diethylene glycol dimethyl ether): 75 parts by weight Then, the components by the below-mentioned amounts were mixed and dispersed sufficiently so as to obtain a light blocking layer composition.

The above-mentioned black pigment dispersion liquid: 61 parts by weight

The above-mentioned photo-curing resin composition (1): 20 parts by weight

Diethylene glycol dimethyl ether: 30 parts by weight

The above-mentioned light blocking layer composition was applied on the glass substrate having a 1.1 mm thickness (produced by Asahi Glass Corp., Al material) with a spin coater, and dried at 100° C. for 3 minutes so as to form a light blocking layer of about 1 μm film thickness. The light blocking layer was exposed by an extra-high pressure mercury lamp in a light blocking pattern, and developed by an 0.05% aqueous solution of potassium hydroxide. Then, by leaving the substrate in an atmosphere at 180° C. for 30 minutes, a heat treatment was applied so as to form the black matrix in the area for forming a light blocking part.

<Formation of a Coloring Layer>

A red photo-curing resin composition with the below-mentioned composition was applied onto the substrate produced as mentioned above by the spin coating method (application thickness 1.5 μm), and was dried in an oven at 70° C. for 30 minutes.

With a photo mask disposed at a 100 μm distance from the coated film of the red photo-curing resin composition, an ultraviolet ray was directed only to the area corresponding to the coloring layer formation area for 10 seconds using a 2.0 kW extra-high pressure mercury lamp by a proximity aligner. Then, it was soaked in a 0.05% aqueous solution of potassium hydroxide (liquid temperature: 23° C.) for 1 minute for alkaline development so as to eliminate only the unhardened part of the red photo-curing resin composition coated film. A red relief pattern was formed in the area for forming red pixels by applying a heat treatment by leaving the substrate in an atmosphere at 180° C. for 30 minutes.

Next, with the green photo-curing resin composition with the below-mentioned composition, a green relief pattern was formed in the area for forming green pixels in the same step as in the red relief pattern formation.

Furthermore, with the blue photo-curing resin composition with the below-mentioned composition, a blue relief pattern was formed in the area for forming blue pixels in the same step as in the red relief pattern formation so as to produce a coloring layer of three colors including red (R), green (G), and blue (B).

a. Red photo-curing resin composition:
C. I. Pigment red 177: 10 parts by weight polysulfonic acid type polymer dispersing agent: 3 parts by weight
the above-mentioned photo-curing resin composition (1): 5 parts by weight
3-methoxy butyl acetate: 82 parts by weight
b. Green photo-curing resin composition:
C. I. Pigment green 36: 10 parts by weight polysulfonic acid type polymer dispersing agent: 3 parts by weight
the above-mentioned photo-curing resin composition (1): 5 parts by weight
3-methoxy butyl acetate: 82 parts by weight
c. Blue photo-curing resin composition:
C. I. Pigment blue: 10 parts by weight
polysulfonic acid type polymer dispersing agent: 3 parts by weight
the above-mentioned photo-curing resin composition (1): 5 parts by weight
3-methoxy butyl acetate: 82 parts by weight Example 4

Application of the Photo-Curing Resin Composition (1)

The photo-curing resin composition (1) with the above-mentioned composition was applied on a glass substrate with a coloring layer formed in the Example 3 by the spin coating method, and dried so as to form a coated film with a 2 µm dry film thickness.

<Exposure and Development>

With a photo mask disposed at a 100 µm distance from the coated film of the photo-curing resin composition (1), an ultraviolet ray was directed only to the area corresponding to the coloring layer formation area for 10 seconds using a 2.0 kW extra-high pressure mercury lamp by a proximity aligner. Then, it was soaked in a 0.05% aqueous solution of potassium hydroxide (liquid temperature: 23° C.) for 1 minute for alkaline development so as to eliminate only the unhardened part of the photo-curing resin composition coated film. A protection film was formed by applying a heat treatment by leaving the substrate in an atmosphere at 200° C. for 30 minutes, thereby obtaining a color filter according to the present invention.

Example 5

Preparation of Photo-Curing Resin Compositions (2) and (2')

A photo-curing resin composition (2) was obtained by agitating and mixing the materials of the below-mentioned amounts at a room temperature.

Moreover, with the reaction liquid obtained in the Example 1 not applied with the alcohol treatment used instead of the reaction product applied with the alcohol treatment in the below-mentioned composition, a photo-curing resin composition (2') was obtained.

Reaction product applied with the alcohol treatment obtained in the Example 1 (23.2% by weight solid component): 970 parts by weight
Dipentaerythritol pentaacrylate (produced by Thertomer Corp., SR399): 18.0 parts by weight
Orthocresol novolak type epoxy resin (produced by Yuka Shell Epoxy Corp., Epi Coat 180S70): 25.0 parts by weight
2-benzyl-2-N,N-dimethylamino-1-(4-morfolyno phenyl)-1-butanone: 2.5 parts by weight
2,2'-bis(o-chrolo phenyl)-4,5,4',5'-tetra phenyl-1,2'-biimidazol: 2.0 parts by weight
Polyoxy ethylene octyl phenyl ether (Nonion HS-210, produced by Nippon Yushi Corp.): 3.6 parts by weight
Propylene glycol monomethyl ether acetate: 59.0 parts by weight <Storage Test>

The viscosity of the above-mentioned photo-curing resin compositions (2) and (2') was measured by a B type viscometer immediately after the preparation. It was 20.0 mPa·s/25° C. for the photo-curing resin composition (2'), and it was 18.5 mPa·s/25° C. for the photo-curing resin composition (2) applied with the alcohol treatment. Furthermore, the viscosity was measured after refrigeration, storage in a room temperature, and at a high temperature of the photo-curing resin compositions (2) and (2'). Results are shown in the below-mentioned table.

TABLE 2

|  | Photo-curing resin composition (2) (alcohol treatment) | Photo-curing resin composition (2') (untreated) |
|---|---|---|
| Refrigeration storage (2 weeks) | 1.032 times | 1.049 times |
| Room temperature storage (2 weeks) | 1.064 times | 1.208 times |

<Application of the Photo-Curing Resin Composition (2)

The photo-curing resin composition (2) with the above-mentioned composition was applied on a glass substrate with a coloring layer formed in the Example 3 by the spin coating method, and dried so as to form a coated film with a 5 µm dry film thickness.

<Exposure and Development>

With a photo mask designed for forming an exposure pattern with predetermined shape, size, and interval, disposed at a 100 µm distance from the coated film of the photo-curing resin composition (2), an ultraviolet ray was directed only to the spacer formation area on the black matrix for 10 seconds using a 2.0 kW extra-high pressure mercury lamp by a proximity aligner. Then, it was soaked in a 0.05% aqueous solution of potassium hydroxide (liquid temperature: 23° C.) for 1 minute for alkaline development so as to eliminate only the unhardened part of the photo-curing resin composition coated film. A fixing spacer was formed by applying a heat treatment by leaving the substrate in an atmosphere at 200° C. for 30 minutes, thereby obtaining a color filter according to the present invention.

Example 6

A transparent electrode film was formed on the surface including the fixing spacer of the color filter obtained in the example 5 by a DC magnetron sputtering method with argon and oxygen used as the discharging gas at a 200° C. substrate temperature, and ITO as the target. Then, an alignment layer comprising polyimide was further formed on the transparent electrode film.

The above-mentioned color filter and a glass substrate with TFT were jointed for cell assembly with the use of an epoxy resin as a sealing material by applying a 0.3 kg/cm² pressure at 150° C., and thereafter a TN liquid crystal was sealed therein, thereby producing a liquid crystal display device according to the present invention.

Example 7

A transparent electrode film was formed on the coloring layer of the glass substrate formed in the example 3, or on the protection film of the color filter with the coloring layer and the protection film formed in the example 4, by a DC magnetron sputtering method with argon and oxygen used as the discharging gas at a 200° C. substrate temperature, and ITO as the target. Then, a spacer was formed on the transparent electrode film in the same step as in the example 5, and an alignment layer comprising polyimide was further formed so as to obtain a color filter.

The above-mentioned color filter and a glass substrate with TFT were jointed for cell assembly with the use of an epoxy resin as a sealing material by applying a 0.3 kg/cm$^2$ pressure at 150° C., and thereafter a TN liquid crystal was sealed therein, thereby producing a liquid crystal display device according to the present invention.

Example 8

In the same procedure as in the example 1 except that the polymerization initiator at the time of preparing a material polymer and/or a polymerization inhibitor at the time of reacting 2-methacryloyloxy ethyl isocyanate were changed, 6 kinds of reaction liquids were obtained. The reaction liquids were provided as photo-curing polymer samples (8a to 8f) to the transparency test. The polymerization initiators and the polymerization inhibitors used for producing the samples are as follows. The sample 8e is the photo-curing polymer obtained in the example 1 as it is.

<Sample 8a>
Polymerization initiator (non-nitrile-based): 5 g of dimethyl 2,2'-azo bis(2-methyl propionate)
Polymerization inhibitor: 2.5 g of 3,5 di-tert-butyl-4-hydroxy toluene (BHT)

<Sample 8b>
Polymerization initiator (non-nitrile-based): 5 g of dimethyl 2,2'-azo bis(2-methyl propionate)
Polymerization inhibitor: 2.5 g of hydro quinone <sample 8c>
Polymerization initiator (non-nitrile-based): 5 g of dimethyl 2,2'-azo bis(2-methyl propionate)
Polymerization inhibitor: 2.5 g of metho quinone <Sample 8d>
Polymerization initiator (nitrile-based): 5 g of azo bis isobutyl nitrile
Polymerization inhibitor: 2.5 g of 3,5 di-tert-butyl-4-hydroxy toluene (BHT)

<Sample 8e>
Polymerization initiator (nitrile-based): 5 g of azo bis isobutyl nitrile
Polymerization inhibitor: 2.5 g of hydro quinone <Sample 8f>
Polymerization initiator (nitrile-based): 5 g of azo bis isobutyl nitrile
Polymerization inhibitor: 2.5 g of metho quinone <Measurement of the light Transmittance>

The reaction liquids as the photo-curing polymer samples (8a to 8f) were diluted with 3-methoxy butyl acetate so as to prepare a solution with a 20% by weight resin component, and placed in a 1 cm square quarts cell for measuring the light transmittance in the range from 350 nm to 550 nm.

Figure 3:
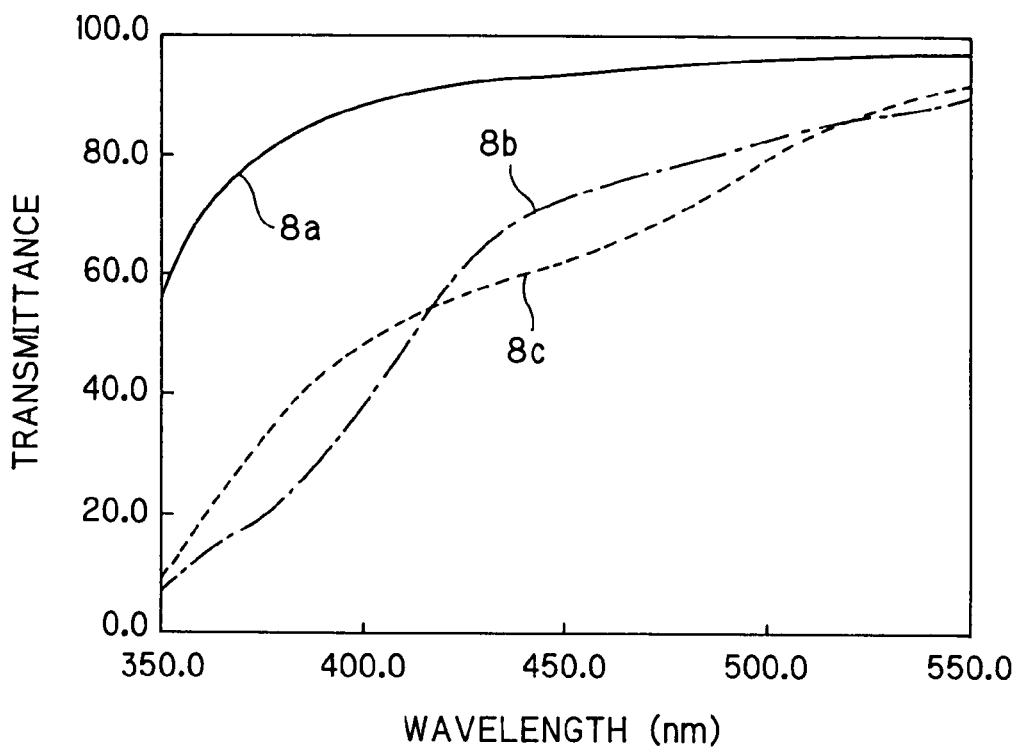
FIG. 3 is a graph showing the light transmittance of a photo-curing polymer synthesized in an example.
Figure 4:
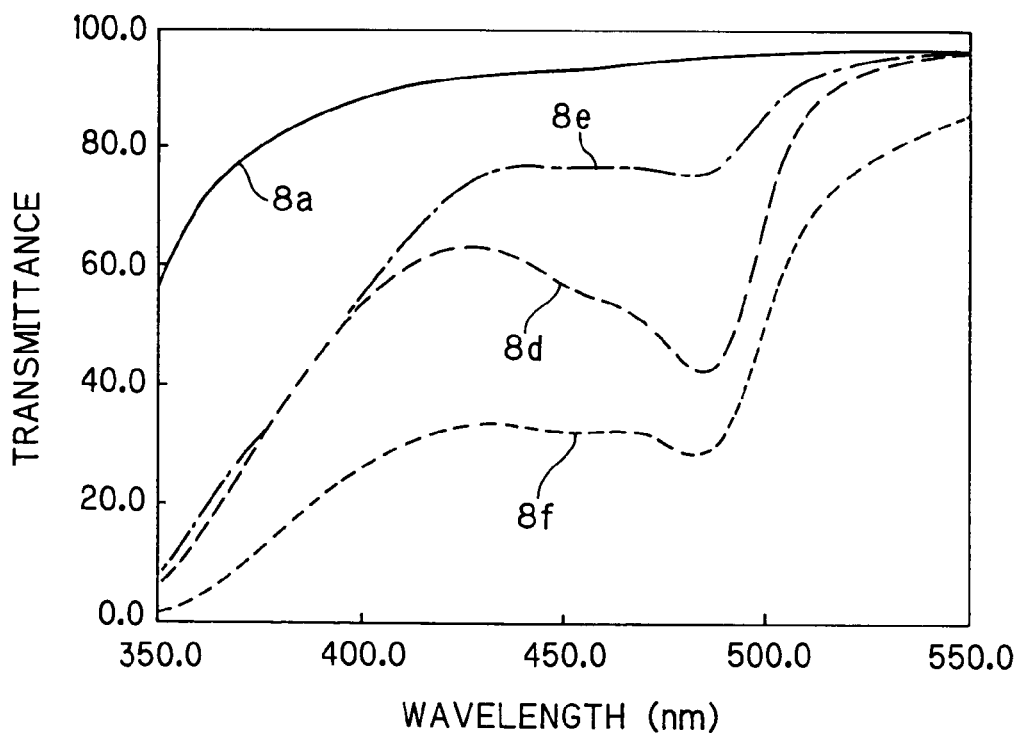
FIG. 4 is a graph showing the light transmittance of a photo-curing polymer synthesized in an example.

The measurement results are shown in Table 3, FIG. 3, and FIG. 4. Table 3 shows the light transmittance of each sample at 360 nm (ultraviolet), 400 nm (visible), and 485 nm (visible). FIG. 3 shows the transmittance curve of the samples with the same non-nitrile-based polymerization initiator and different polymerization inhibitors. Moreover, FIG. 4 shows the transmittance curve of the samples with the same nitrile-based polymerization initiators and different polymerization inhibitor. However, FIG. 4 also shows the transmittance curve of the sample 8a using the non-nitrile-based polymerization initiator.

TABLE 3

|  | 360 nm | 400 nm | 485 nm |
|---|---|---|---|
| Sample 8a | 70 (%) | 87 (%) | 94 (%) |
| Sample 8b | 12 | 38 | 78 |
| Sample 8c | 19 | 47 | 72 |
| Sample 8d | 14 | 52 | 42 |
| Sample 8e | 17 | 53 | 75 |
| Sample 8f | 4 | 26 | 28 |

Although drop of the transmittance is observed in the vicinity of 485 nm in the sample group using the nitrile-based polymerization initiator shown in FIG. 4, the drop of the transmittance is not observed in the vicinity of 485 nm in the sample group using the non-nitrile-based polymerization initiator shown in FIG. 3. Moreover, among the sample group using the non-nitrile-based polymerization initiator shown in FIG. 3, the sample 8a using the BHT shows a high transmittance in the ultraviolet ray area and in the visible area. Furthermore, the sample 8a using a combination of the non-nitrile-based polymerization initiator and the BHT shows the highest transmittance in all the samples over the entire range of the measured wavelength including the ultraviolet area and the visible area. Moreover, it was confirmed that the sample 8a shows a high transmittance of 96% or more also in the visible area of 550 to 700 nm (not illustrated).

As heretofore explained, according to the present invention, an alcohol treated product with a molecular structure having a principal chain including at least a component unit having an acidic functional group and a component unit having a hydroxyl group, wherein an isocyanate compound is amido-bonded with at least a part of the acidic functional group via an isocyanate group of the isocyanate compound and/or urethane-bonded with at least a part of the hydroxyl group via an isocyanate group of the isocyanate compound can be obtained. The alcohol treated product is not liable to cause the molecular weight increase or the viscosity rise even if it is dissolved or dispersed in a solvent so that it has extremely high stability compared with the product not applied with the alcohol treatment. Therefore, the excellent storage property of a prepared solution can be provided so that a long term storage in a room temperature can be enabled. Moreover, since a solution of the alcohol treated product does not have a viscosity rise during use, and thus it can be handled easily.

Particularly by mixing the photo-curing polymer represented by the above-mentioned formula (8) with another resist material after sufficient maturation, a photo resist material suitable for forming a protection film for covering a coloring layer of a color filter or a column-like spacer for maintaining the cell gap of a liquid crystal panel can be obtained. The resist material can be stored over a long term at a room temperature. Besides, since the viscosity is not changed even during the application by a spin coater, a protection layer with a desired film thickness or a column-like spacer with a desired height can be formed accurately. Therefore, the color irregularity and the contrast irregularity of the liquid crystal display device can be reduced as well.

Moreover, by preparing a material polymer using a non-nitrile-based azo polymerization initiator at the time of producing a highly stable resin according to the present invention and/or by introducing an isocyanate compound using a polymerization inhibitor selected from the compounds represented by the above-mentioned formulae (10) and (16), a highly stable resin with the excellent transparency can be obtained. Therefore, demand for the transparency necessary for a coloring layer of a color filter and a protection film can be satisfied.

What is claimed is:

1. A production method for a highly stable polymer comprising the steps of:
   (1) reacting a polymer having a principal chain including at least a component unit having a pendant acidic group and a component unit having a pendant hydroxyl group with an isocyanate compound until an isocyanate group, as measured by an IR absorption spectrum at a peak of 2,200 cm$^{-1}$, is no longer present to form an intermediate product, said intermediate product featuring: pendant groups having amido linkages and/or pendant groups having urethane linkages, and pendant acid anhydride groups formed by dehydration of un-reacted acidic groups;
   (2) preparing a solution by dissolving or dispersing the intermediate product in a solvent; and
   (3) adding an alcohol to the solution, before viscosity rise of the solution or before completion of viscosity rise of the solution, and thereby reacting the alcohol with said pendant acid anhydride groups of the intermediate product;
   wherein said alcohol has about 1 to 20 carbon atoms and is selected from the group consisting of linear alkanols, cellosolve-based alcohols, carbitol-based alcohols, ether-based alcohols, and ethylenically unsaturated alcohols.

2. The production method for a highly stable polymer according to claim 1, wherein the polymer solution is left or heated for a predetermined time for maturation after the addition of the alcohol.

3. The production method for a highly stable polymer according to claim 1, wherein the polymer solution is matured at 30 to 170° C. for a period within 72 hours.

4. The production method for a highly stable polymer according to claim 1, wherein the principal chain of the polymer comprises at least a component unit represented by the below-mentioned formula (1) and a component unit represented by the below-mentioned formula (2):

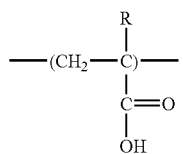

Formula (1)

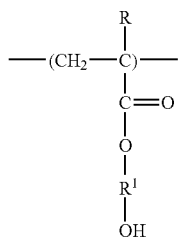

Formula (2)

wherein R is hydrogen or an alkyl group having 1 to 5 carbon atoms, $R^1$ is an alkylene group having 2 to 4 carbon atoms.

5. The production method for a highly stable polymer according to claim 1, wherein the iscoyanate compound has a reactive group other than the iscoyanate group.

6. The production method for a highly stable polymer according to claim 5, wherein the isocyanate group is a radical polymerizable group-containing isocyanate compound.

7. The production method for a highly stable polymer according to claim 1, wherein said polymer having a principal chain including at least a component unit having a pendant acid group and a component unit having a pendant hydroxyl group is a polymer formed using a non-nitrile azo-based polymerization initiator or a peroxide-based polymerization initiator.

8. The production method for a highly stable polymer according to claim 7, wherein a highly stable resin with the light transmittance of a 3-methoxyl butyl acetate solution of a 20% by weight resin solid component placed in a 1 cm square quartz cell at 400 nm being 60% or more is obtained.

9. The production method for a highly stable polymer according to claim 7, wherein a highly stable resin with the light transmittance of a 3-methoxy butyl acetate solution of a 20% by weight resin solid component placed in a 1 cm square quartz cell at 360 nm being 50% or more is obtained.

10. The production method for a highly stable polymer according to claim 1, wherein the isocyanate compound is reacted with the polymer, using a polymerization inhibitor selected from the group consisting of a phenol-based compound represented by the below-mentioned formula (10) and a phosphite-based compound represented by the below-mentioned formula (16):

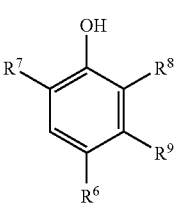

Formula (10)

wherein $R^6$ is hydrogen, an alkyl group having 1 to 5 carbon atoms, or the below-mentioned formula (11):

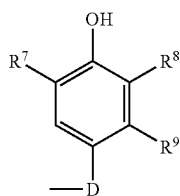

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms $R^8$ is hydrogen, an alkyl group having 1 to 10 carbon atoms, or the below:

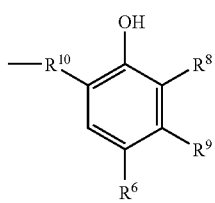

Formula (12)

wherein $R^{10}$ in the formula (12) is a alkylene group having 1 to 10 carbon atoms or an alkylidene group having 1 to 10 carbon atoms, $R^9$ is hydrogen or an alkyl group having 1 to 10 carbon atoms, however, at least one of $R^7$ and $R^8$ is a tert-butyl group, or an alkyl group having a cyclohexyl group, and substituents of the numeral can either be same or different,

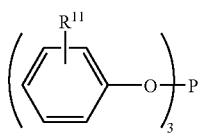

Formula (16)

wherein $R^{11}$ is hydrogen or an alkyl group having 1 to 20 carbons atoms.

11. The production method for a highly stable polymer according to claim 10, wherein a highly stable resin with the light transmittance of a 3-methoxyl butyl acetate solution of a 20% by weight resin solid component placed in a 1 cm square quartz cell at 400 nm being 60% or more is obtained.

12. The production method for a highly stable polymer according to claim 10, wherein a highly stable resin with the light transmittance of a 3-methoxyl butyl acetate solution of a 20% by weight resin solid component placed in a 1 cm square quartz cell at 360 nm 50% or more is obtained.

13. A production method for a hardenable resin composition comprising the steps of: (1) forming a highly stable polymer according to the production method of claim 1; (2) leaving or heating the polymer solution for a predetermined time for maturation; and (3) adding other coating materials to the matured polymer solution.

14. The production method for a hardenable resin composition according to claim 13, wherein the principal chain of the polymer comprises at least a component unit represented by the below-mentioned formula (1) and a component unit represented by the below-mentioned formula (2):

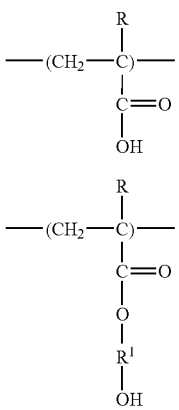

Formula (1)

Formula (2)

wherein R is hydrogen or alkyl group having 1 to 5 carbon atoms, and $R^1$ is an alkylene group having 2 to 4 carbons atoms; the isocyanate compound is a radical polymerizable group-containing isocyanate compound, and the polymer solution is matured at 30 to 170° C. for a period within 72 hours.

15. The production method for a hardenable resin composition according to claim 13, wherein said polymer having a principal chain including at least a component unit having a pendant acid group and a component unit having a pendant hydroxyl group is a polymer formed using a non-nitrile azo-based polymerization initiator or a peroxide-based polymerization initiator, and the polymer is reacted with the isocyanate compound, using a polymerization inhibitor selected from the group consisting of a phenol-based compound represented by the below-mentioned formula (10) and a phosphite-based compound represented by the below mentioned formula (16):

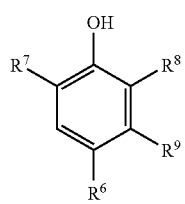

Formula (10)

wherein $R^6$ is hydrogen, and alkyl group having 1 to 5 carbon atoms, or the below mentioned formula (11):

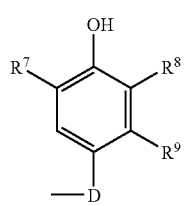

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

Formula (12)

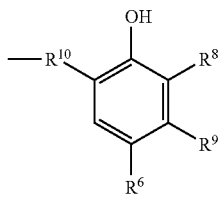

wherein $R^{10}$ in the formula (12) is an alkylene group having 1 to 10 carbon atoms or an alkylidene group having 1 to 10 carbons atoms, $R^9$ is hydrogen or an alkyl group having 1 to 10 carbon atoms, however, at least one $R^7$ and $R^8$ is a tert-butyl group, or an alkyl group having a cyclohexyl group, and substituents of the same numeral can either be same or different, Formula (16)

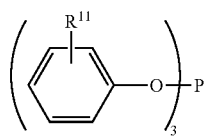

wherein $R^{11}$ is hydrogen or an alkyl group having 1 to 20 carbon atoms.

16. The production method for a hardenable resin composition according to claim 15, wherein said highly stable polymer has a light transmittance of a 3-methoxy butyl acetate solution of a 20% by weight resin solid component placed in a 1 cm square quartz cell at 400 nm being 60% or more.

17. The production method for a hardenable resin composition according to claim 15, wherein said highly stable polymer has a light transmittance of 3-methoxy butyl acetate solution of a 20% by weight resin solid component placed in a 1 cm square quartz cell at 360 nm being 50% or more.

18. The production method for a hardenable resin composition according to claim 13, wherein the alcohol has a boiling point with a 75° C. or less difference with respect to the boiling point of the solvent and/or an evaporation rate with a 90(n-BuOAc=100) or less difference with respect to the evaporation rate of the solvent.

19. A highly stable polymer comprising a polymer obtained by the production method according to claim 1, wherein the highly stable polymer contains substantially no acid anhydride groups.

20. The highly stable polymer according to claim 19, wherein the principal chain comprises at least a component unit represented by the below-mentioned formula (1) and a component unit represented by the below-mentioned formula (2):

Formula (1)

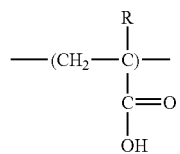

Formula (2)

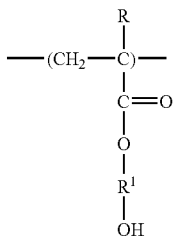

wherein R is hydrogen or an alkyl group having 1 to 5 carbon atoms, and $R^1$ is an alkylene group having 2 to 4 carbon atoms.

21. The highly stable polymer according to claim 19, wherein the isocyanate compound has a reactive group other than the isocyanate group.

22. The highly stable polymer according to claim 21, wherein the isocyanate group is a radical polymerizable group-containing isocyanate compound.

23. The highly stable polymer according to claim 19, wherein said polymer having a principal chain including at least a component unit having a pendant acid group and a component unit having a pendant hydroxyl group is formed using a non-nitrile azo-based polymerization initiator or a peroxide-based polymerization initiator.

24. The highly stable polymer according to claim 23, wherein the light transmittance of a 3-methoxyl butyl acetate solution of a 20% by weight resin solid component placed in a 1 cm square quartz cell at 400 nm is 60% or more.

25. The highly stable polymer according to claim 23, wherein the light transmittance of 3-methoxyl butyl acetate solution of a 20% by weight resin solid component placed in a 1 cm square quartz cell at 360 nm is 50% or more.

26. The highly stable polymer according to claim 19, wherein the isocyanate compound is introduced in the principal chain part of the highly stable resin, using a polymerization inhibitor selected from the group consisting of a phenol-based compound represented by the below-mentioned formula (10) and a phosphite-based compound represented by the below-mentioned formula (16):

Formula (10)

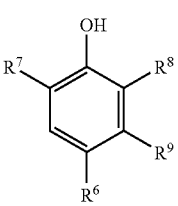

wherein $R^6$ is hydrogen, an alkyl group having 1 to 5 carbon atoms, or the below-mentioned formula (11):

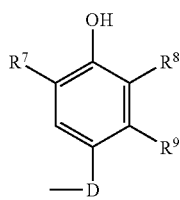

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

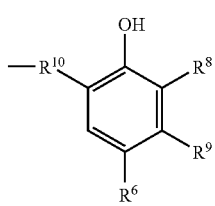

Formula (12)

wherein $R^{10}$ in the formula (12) is an alkylene group having 1 to 10 carbon atoms or an alkylidene group having 1 to 10 carbon atoms or an alkylidene group having 1 to 10 carbon atoms, $R^9$ is hydrogen or an alkyl group having 1 to 10 carbon atoms however, at least one of $R^7$ and $R^8$ is a tert-butyl group, or an alkyl group having a cyclohexyl group, and substituents of the same numeral can either be same or different,

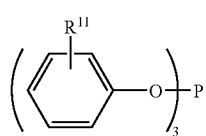

Formula (16)

wherein $R^{11}$ is hydrogen or an alkyl group having 1 to 20 atoms.

27. The highly stable polymer according to claim 26, wherein the light transmittance of a 3-methoxyl butyl acetate solution of a 20% by weight resin solid component placed in a 1 cm square quartz cell at 400 nm is 60% or more.

28. The highly stable polymer according to claim 26, wherein the light transmittance of a 3-methoxyl butyl acetate solution of a 20% by weight resin solid component placed in a 1 cm square quartz cell at 360 nm is 50% or more.

29. A hardenable resin composition containing: the highly stable polymer according to claim 19 and other coating materials.

30. The hardenable resin composition according to claim 29, wherein the polymer solution is left or heated for a predetermined time for maturation after the addition of the alcohol.

31. The hardenable resin composition according to claim 29, wherein the alcohol has a boiling point with a 75° C. or less difference with respect to the boiling point of the solvent to be used and/or an evaporation rate with a 90(n-BuOAc=100) or less difference with respect to the evaporation rate of the solvent.

32. The hardenable resin composition according to claim 29 wherein, the principal chain of the polymer comprises at least a component unit represented by the below-mentioned formula (1) and a component unit represented by the below-mentioned formula (2):

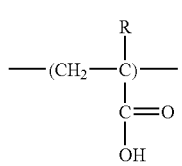

Formula (1)

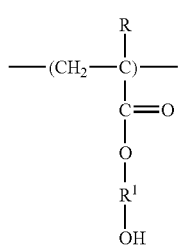

Formula (2)

wherein R is hydrogen or an alkyl group having 1 to 5 carbon atoms, $R^1$ is an alklene group having 2 to 4 carbon atoms, and the isocyanate compound is a radical polymerizable group-containing isocyanate compound.

33. The hardenable resin composition according to claim 29, wherein said polymer having a principal chain including at least a component unit having a pendant acid group and a component unit having a pendant hydroxyl group is a polymer formed using a non-nitrile azo-based polymerization initiator or a peroxide-based polymerization initiator, and the polymer is reacted with the isocyanate compound, using a polymerization inhibitor selected from the group consisting of a phenol-based compound represented by the below-mentioned formula (10) and a phosphite-based compound represented by the below mentioned formula (16):

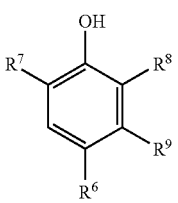

Formula (10)

wherein $R^6$ is hydrogen, and alkyl group having 1 to 5 carbon atoms, or the below mentioned formula (11):

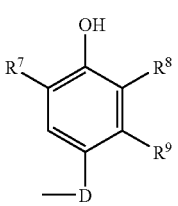

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

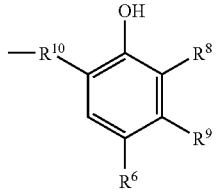

Formula (12)

wherein $R^{10}$ in the formula (12) is an alkylene group having 1 to 10 carbon atoms or an alkylidene group having 1 to 10 carbons atoms, $R^9$ is hydrogen or an alkyl group having 1 to 10 carbon atoms, however, at least one $R^7$ and $R^8$ is a tert-butyl group, or an alkyl group having a cyclohexyl group, and substituents of the same numeral can either be same or different,

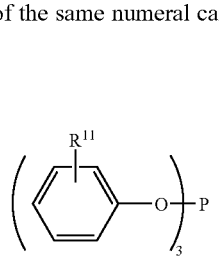

Formula (16)

wherein $R^{11}$ is hydrogen or an alkyl group having 1 to 20 carbon atoms.

34. The hardenable resin composition according to claim 33, wherein said highly stable polymer has a light transmittance of a 3-methoxy butyl acetate solution of a 20% by weight resin solid component placed in a 1 cm square quartz cell at 400 nm being 60% or more.

35. The hardenable resin composition according to claim 33, wherein said highly stable polymer has a light transmittance of 3-methoxy butyl acetate solution of a 20% by weight resin solid component placed in a 1 cm square quartz cell at 360 nm being 50% or more.

36. A highly stable polymer comprising a polymer obtained by the production method according to claim 1, wherein the principal chain further contains component unit having a pendant benzene ring, and wherein the highly stable polymer features pendant acid anhydride groups in an amount such that the area ratio represented by the acid anhydride group (1,783 to 1,822 cm$^{-1}$)/benzene ring (683 to 721 cm$^{-1}$), is 0.03 or less by the FT-IR spectrum.

37. The highly stable polymer according to claim 36, wherein the principal chain comprises at least a component unit represented by the below-mentioned formula (1) component unit represented by the below-mentioned formula (2):

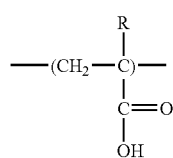

Formula (1)

-continued

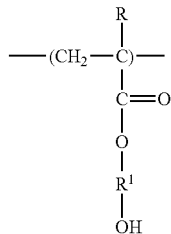

Formula (2)

wherein R is hydrogen or an alkyl group having 1 to 5 carbon atoms, and $R^1$ is an alkylene group having 2 to 4 carbon atoms.

38. The highly stable polymer according to claim 36, wherein the isocyanate compound has a reactive group other than the isocyanate group.

39. The highly stable polymer according to claim 38, wherein the isocyanate group is radical polymerizable group-containing isocyanate compound.

40. The highly stable polymer according to claim 36, wherein said polymer having a principal chain including at least a component unit having a pendant acid group and a component unit having a pendant hydroxyl group is formed using a non-nitrile azo-based polymerization initiator or a peroxide-based polymerization initiator.

41. The highly stable polymer according to claim 40, wherein the light transmittance of a 3-methoxyl butyl acetate solution of a 20% by weight resin solid component placed in a 1 cm square quartz cell at 400 nm is 60% or more.

42. The highly stable polymer according to claim 40, wherein the light transmittance of a 3-methoxyl butyl acetate solution of a 20% by weight resin solid component placed in a 1 cm square quartz cell at 360 nm is 50% or more.

43. The highly stable polymer according to claim 36, wherein the isocyanate compound is introduced in the principal chain part of the highly stable resin, using a polymerization inhibitor selected from the group consisting of a phenol-based compound represented by the below-mentioned formula (10) and a phosphite-based compound represented by the below-mentioned formula (16):

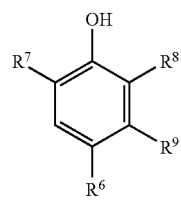

Formula (10)

wherein $R^6$ is hydrogen, an alkyl group having 1 to 5 carbon atoms, or the below-mentioned formula (11):

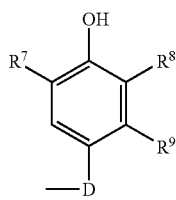

Formula (11)

wherein D in the formula (11) —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

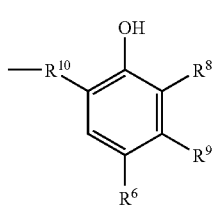

Formula (12)

wherein $R^{10}$ in the formula (12) is an alkylene group having 1 to 10 carbon atoms or a alkylidene group having 1 to 10 carbon atoms or an alkylidene group having 1 to 10 carbon atoms, $R^9$ is hydrogen or an alkyl group having 1 to 10 carbon atoms however, at least one of $R^7$ and $R^8$ is a tert-butyl group, or an alkyl group having a cyclohexyl group, and substituents of the same numeral can either be same or different,

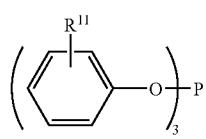

Formula (16)

wherein $R^{11}$ is hydrogen or an alkyl group having 1 to 20 carbon atoms.

44. The highly stable polymer according to claim 43, wherein the light transmittance of a 3-methoxyl butyl acetate solution of a 20% by weight resin solid component placed in a 1 cm square quartz cell at 400 nm is 60% or more.

45. The highly stable polymer according to claim 43, wherein the light transmittance of a 3-methoxyl butyl acetate solution of a 20% by weight resin solid component placed in a 1 cm square quartz cell at 360 nm is 50% or more.

46. A hardenable resin composition containing: the highly stable polymer according to claim 36 and other coating materials.

47. The hardenable resin composition according to claim 46, wherein the polymer solution is left or heated for a predetermined time for maturation after the addition of the alcohol.

48. The hardenable resin composition according to claim 46, wherein the alcohol has a boiling point with a 75° C. or less difference with respect to the boiling point of the solvent to be used and/or an evaporation rate with a 90(n-BuOAc=100) or less difference with respect to the evaporation rate of the solvent.

49. The hardenable resin composition according to claim 46, wherein, the principal chain of the polymer comprises at least a component unit represented by the below-mentioned formula (1) and a component unit represented by the below-mentioned formula (2):

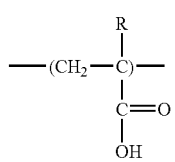

Formula (1)

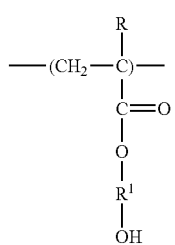

Formula (2)

wherein R is hydrogen or an alkyl group having 1 to 5 carbon atoms, and $R^1$ is an alkylene group having 2 to 4 carbons atoms, and the isocyanate compound is a radical polymerizable group-containing isocyanate compound.

50. The hardenable resin composition according to claim 46, wherein said polymer having a principal chain including at least a component unit having a pendant acid group and a component unit having a pendant hydroxyl group is a polymer formed using a non-nitrile azo-based polymerization initiator or a peroxide-based polymerization initiator, and the polymer is reacted with the isocyanate compound, using a polymerization inhibitor selected from the group consisting of a phenol-based compound represented by the below-mentioned formula (10) and a phosphite-based compound represented by the below mentioned formula (16):

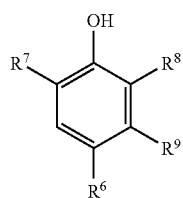

Formula (10)

wherein $R^6$ is hydrogen, and alkyl group having 1 to 5 carbon atoms, or the below mentioned formula (11):

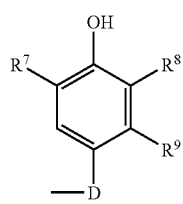

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

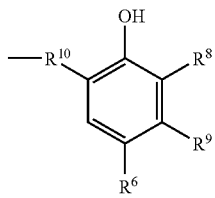

Formula (12)

wherein $R^{10}$ in the formula (12) is an alkylene group having 1 to 10 carbon atoms or an alkylidene group having 1 to 10 carbons atoms, $R^9$ is hydrogen or an alkyl group having 1 to 10 carbon atoms, however, at least one $R^7$ and $R^8$ is a tert-butyl group, or an alkyl group having a cyclohexyl group, and substituents of the same numeral can either be same or different,

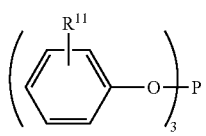

Formula (16)

wherein $R^{11}$ is hydrogen or an alkyl group having 1 to 20 carbon atoms.

51. The hardenable resin composition according to claim 50, wherein said highly stable polymer has a light transmittance of a 3-methoxy butyl acetate solution of a 20% by weight resin solid component placed in a 1 cm square quartz cell at 400 nm being 60% or more.

52. The hardenable resin composition according to claim 50, wherein said highly stable polymer has a light transmittance of 3-methoxy butyl acetate solution of a 20% by weight resin solid component placed in a 1 cm square quartz cell at 360 nm being 50% or more.

53. A highly stable polymer comprising a polymer obtained by the production method according to claim 1, wherein said alcohol is added in an amount of 10 to 120 parts by weight, with respect to 100 parts by weight of said intermediate product.

54. The highly stable polymer according to claim 53, wherein the principal chain comprises at least a component unit represented by the below-mentioned formula (1) and a component unit represented by the below-mentioned formula (2):

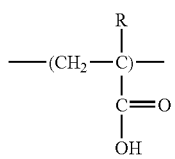

Formula (1)

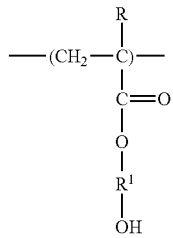

Formula (2)

wherein R is hydrogen or an alkyl group having 1 to 5 carbon atoms, and $R^1$ is an alkylene group having 2 to 4 carbon atoms.

55. The highly stable polymer according to claim 53, wherein the isocyanate compound had a reactive group other than the isocyanate group.

56. The highly stable polymer according to claim 55, wherein the isocyanate group is a radical polymerizable group-containing isocyanate compound.

57. The highly stable polymer according to claim 53, wherein said polymer having a principal chain including at least a component unit having a pendant acid group and a component unit having a pendant hydroxyl group is formed using a non-nitrile azo-based polymerization initiator or a peroxide-based polymerization initiator.

58. The highly stable polymer according to claim 57, wherein the light transmittance of a 3-methoxy butyl acetate solution of a 20% by weight resin solid component placed in a 1 cm square quartz cell at 400 nm is 60% or more.

59. The highly stable polymer according to 57, wherein the light transmittance of a 3-methoxy butyl acetate solution of a 20% by weight resin solid component placed in a 1 cm square quartz cell 360 nm is 50% or more.

60. The highly stable polymer according to claim 53, wherein the isocyanate compound is introduced in the principal chain part of the highly stable resin, using a polymerization inhibitor selected from the group consisting of a phenol-based compound represented by the below-mentioned formula (10) and a phosphite-based compound represented by the below-mentioned formula (16):

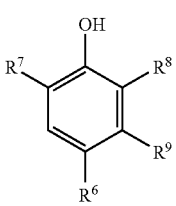

Formula (10)

wherein $R^6$ is hydrogen, an alkyl group having 1 to 5 carbon atoms, or the below-mentioned formula (11):

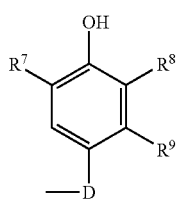

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

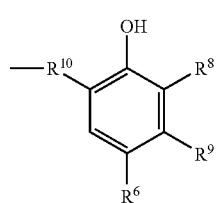

Formula (12)

wherein $R^{10}$ in the formula (12) is an alkylene group having 1 to 10 carbon atoms or an alkylidene group having 1 to 10 carbon atoms or an alkylidene group having 1 to 10 carbon atoms, $R^9$ is hydrogen or an alkyl group having 1 to 10 carbon atoms however, at least one of $R^7$ and $R^8$ is tert-butyl group, or an alkyl group having a cyclohexyl group, and substituents of the same numeral can either be same or different,

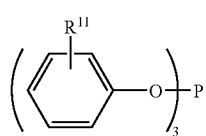

Formula (16)

wherein $R^{11}$ is hydrogen or alkyl group having 1 to 20 carbon atoms.

61. The highly stable polymer according to claim 60, wherein the light transmittance of a 3-methoxy butyl acetate solution of a 20% by weight resin solid component placed in a 1 cm square quartz cell at 400 nm is 60% or more.

62. The highly stable polymer according to claim 60, wherein the light transmittance of a 3-methoxy butyl acetate solution of a 20% by weight resin solid component placed in a 1 cm square quartz cell at 360 nm is 50% or more.

63. A hardenable resin composition containing: the highly stable polymer according to claim 53 and other coating materials.

64. The hardenable resin composition according to claim 63, wherein the polymer solution is left or heated for a predetermined time for maturation after the addition of the alcohol.

65. The hardenable resin composition according to claim 63, wherein the alcohol has a boiling point with a 75° C. or less difference with respect to the boiling point of the solvent to be used and/or an evaporation rate with a 90(n-BuOAc=100) or less difference with respect to the evaporation rate of the solvent.

66. The hardenable resin composition according to claim 63, wherein the principal chain of the polymer comprises at least a component unit represented by the below-mentioned formula (1) and a component unit represented by the below-mentioned formula (2):

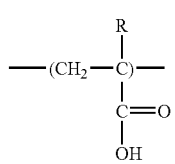

Formula (1)

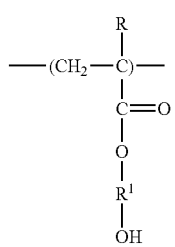

Formula (2)

wherein R is hydrogen or an alkyl group having 1 to 5 carbon atoms, and $R^1$ is an alkylene group having 2 to 4 carbon atoms, and the isocyanate compound is a radical polymerizable group-containing isocyanate compound.

67. The hardenable resin composition according to claim 63, wherein said polymer having a principal chain including at least a component unit having a pendant acid group and a component unit having a pendant hydroxyl group is a polymer formed using a non-nitrile azo-based polymerization initiator or a peroxide-based polymerization initiator, and the polymer is reacted with the isocyanate compound, using a polymerization inhibitor selected from the group consisting of a phenol-based compound represented by the below-mentioned formula (10) and a phosphite-based compound represented by the below mentioned formula (16):

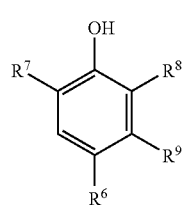

Formula (10)

wherein $R^6$ is hydrogen, and alkyl group having 1 to 5 carbon atoms, or the below mentioned formula (11):

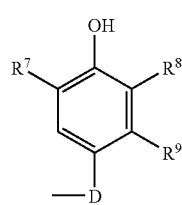

Formula (11)

wherein D in the formula (11) is —S—, an alkylene group having 1 to 10 carbon atoms or an alkylidene group having 1 to 10 carbon atoms, $R^7$ is hydrogen or an alkyl group having 1 to 10 carbon atoms, $R^8$ is hydrogen, an alkyl group having 1 to 10 carbon atoms, or the below-mentioned formula (12):

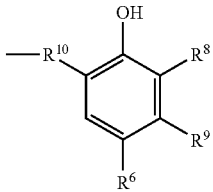

Formula (12)

wherein $R^{10}$ in the formula (12) is an alkylene group having 1 to 10 carbon atoms or an alkylidene group having 1 to 10 carbons atoms, $R^9$ is hydrogen or an alkyl group having 1 to 10 carbon atoms, however, at least one $R^7$ and $R^8$ is a tert-butyl group, or an alkyl group having a cyclohexyl group, and substituents of the same numeral can either be same or different,

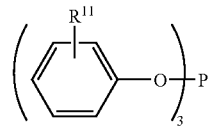

Formula (16)

wherein $R^{11}$ is hydrogen or an alkyl group having 1 to 20 carbon atoms.

68. The hardenable resin composition according to claim 67, wherein said highly stable polymer has a light transmittance of a 3-methoxy butyl acetate solution of a 20% by weight resin solid component placed in a 1 cm square quartz cell at 400 nm being 60% or more.

69. The hardenable resin composition according to claim 67, wherein said highly stable polymer has a light transmittance of 3-methoxy butyl acetate solution of a 20% by weight resin solid component placed in a 1 cm square quartz cell at 360 nm being 50% or more.

* * * * *